United States Patent
Huang et al.

(10) Patent No.: US 11,239,078 B2
(45) Date of Patent: *Feb. 1, 2022

(54) FINE LINE PATTERNING METHODS

(71) Applicant: TAIWAN SEMICONDUCTOR MANUFACTURING CO., LTD., Hsinchu (TW)

(72) Inventors: Shih-Chun Huang, Hsinchu (TW); Chiu-Hsiang Chen, Hsinchu County (TW); Ya-Wen Yeh, Taipei (TW); Yu-Tien Shen, Tainan (TW); Po-Chin Chang, Taichung (TW); Chien Wen Lai, Hsinchu (TW); Wei-Liang Lin, Hsinchu (TW); Ya Hui Chang, Hsinchu (TW); Yung-Sung Yen, New Taipei (TW); Li-Te Lin, Hsinchu (TW); Pinyen Lin, Rochester, NY (US); Ru-Gun Liu, Zhubei (TW); Chin-Hsiang Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/921,032

(22) Filed: Jul. 6, 2020

(65) Prior Publication Data
US 2020/0335340 A1    Oct. 22, 2020

Related U.S. Application Data

(63) Continuation of application No. 16/178,417, filed on Nov. 1, 2018, now Pat. No. 10,707,081.
(Continued)

(51) Int. Cl.
*H01L 21/302* (2006.01)
*H01L 21/033* (2006.01)
(Continued)

(52) U.S. Cl.
CPC ...... *H01L 21/0338* (2013.01); *H01L 21/0217* (2013.01); *H01L 21/0274* (2013.01);
(Continued)

(58) Field of Classification Search
CPC ............ H01L 21/0337; H01L 21/0338; H01L 21/3086; H01L 21/3088; H01L 21/67063; H01L 21/32053; H01L 21/32134
See application file for complete search history.

(56) References Cited

U.S. PATENT DOCUMENTS

| 10,707,081 | B2 * | 7/2020 | Huang | ............... | H01L 21/31116 |
| 2005/0006347 | A1 * | 1/2005 | Gopinath | ........... | H01L 21/31116 |
| | | | | | 216/83 |

(Continued)

OTHER PUBLICATIONS

Non-Final Office Action issued in U.S. Appl. No. 16/178,417, dated Oct. 29, 2019.
(Continued)

*Primary Examiner* — Brian Turner
(74) *Attorney, Agent, or Firm* — McDermott Will & Emery LLP

(57) ABSTRACT

A method of manufacturing a semiconductor device including operations of forming a first hard mask over an underlying layer on a substrate by a photolithographic and etching method, forming a sidewall spacer pattern having a first sidewall portion and a second sidewall portion on opposing sides of the first hard mask, etching the first sidewall portion, etching the first hard mask and leaving the second sidewall
(Continued)

portion bridging a gap of the etched first hard mask, and processing the underlying layer using the second hard mask.

18 Claims, 12 Drawing Sheets

Related U.S. Application Data

(60) Provisional application No. 62/586,830, filed on Nov. 15, 2017.

(51) Int. Cl.
*H01L 21/308* (2006.01)
*H01L 21/311* (2006.01)
*H01L 21/3213* (2006.01)
*H01L 21/027* (2006.01)
*H01L 21/02* (2006.01)
*H01L 21/265* (2006.01)
*H01L 21/3115* (2006.01)

(52) U.S. Cl.
CPC ...... *H01L 21/0332* (2013.01); *H01L 21/0337* (2013.01); *H01L 21/26586* (2013.01); *H01L 21/31116* (2013.01); *H01L 21/31144* (2013.01); *H01L 21/31155* (2013.01)

(56) References Cited

U.S. PATENT DOCUMENTS

| | | | |
|---|---|---|---|
| 2005/0087516 A1* | 4/2005 | Duerksen | H01L 21/76828 216/62 |
| 2006/0211260 A1* | 9/2006 | Tran | H01L 21/3086 438/763 |
| 2006/0273456 A1 | 12/2006 | Sant et al. | |
| 2008/0233691 A1 | 9/2008 | Cheng et al. | |
| 2011/0049582 A1* | 3/2011 | Johnson | H01L 29/66636 257/288 |
| 2012/0125368 A1* | 5/2012 | Kaneko | H01L 21/31133 134/18 |
| 2014/0021492 A1 | 1/2014 | Wolk et al. | |
| 2014/0051229 A1* | 2/2014 | Dimitrakopoulos | H01L 29/1608 438/458 |
| 2014/0190935 A1 | 7/2014 | Horak et al. | |
| 2014/0248778 A1 | 9/2014 | Moll et al. | |
| 2014/0295674 A1 | 10/2014 | Cheng et al. | |
| 2016/0225634 A1 | 8/2016 | Anderson et al. | |
| 2018/0076035 A1 | 3/2018 | Bergendahl et al. | |
| 2018/0130668 A1* | 5/2018 | Liu | H01L 21/31116 |

OTHER PUBLICATIONS

Notice of Allowance issued in U.S. Appl. No. 16/178,417, dated Mar. 4, 2020.

* cited by examiner

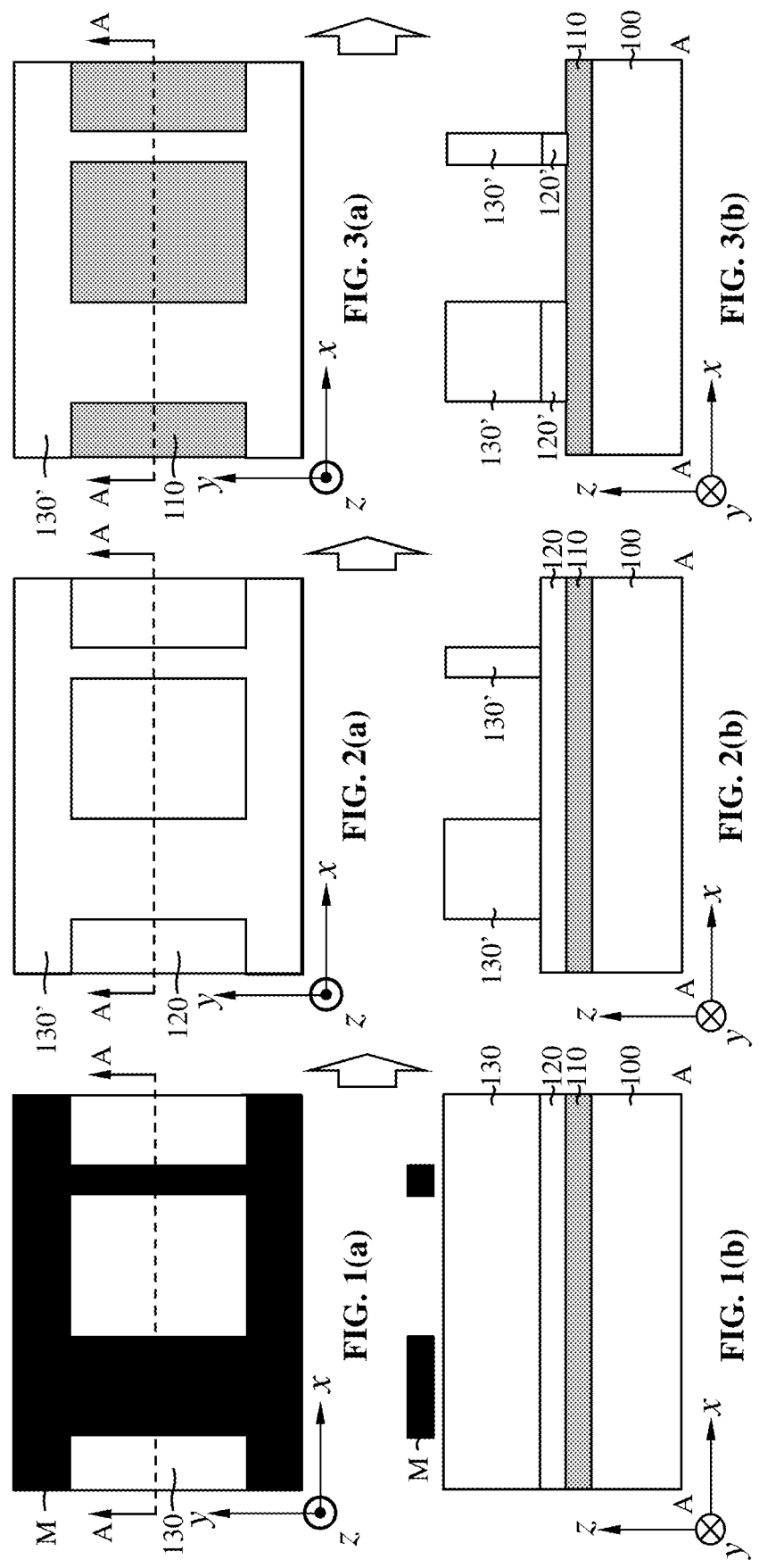

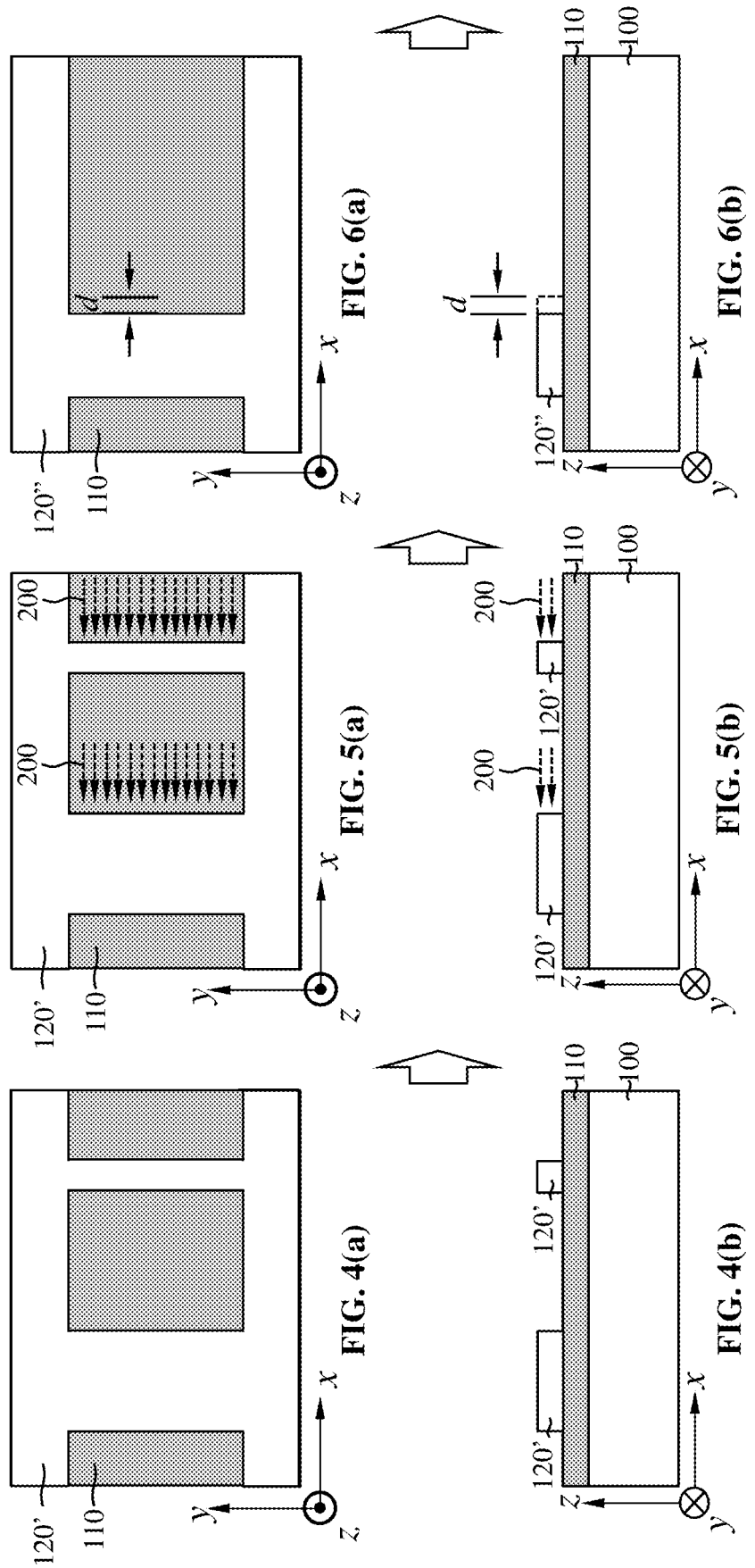

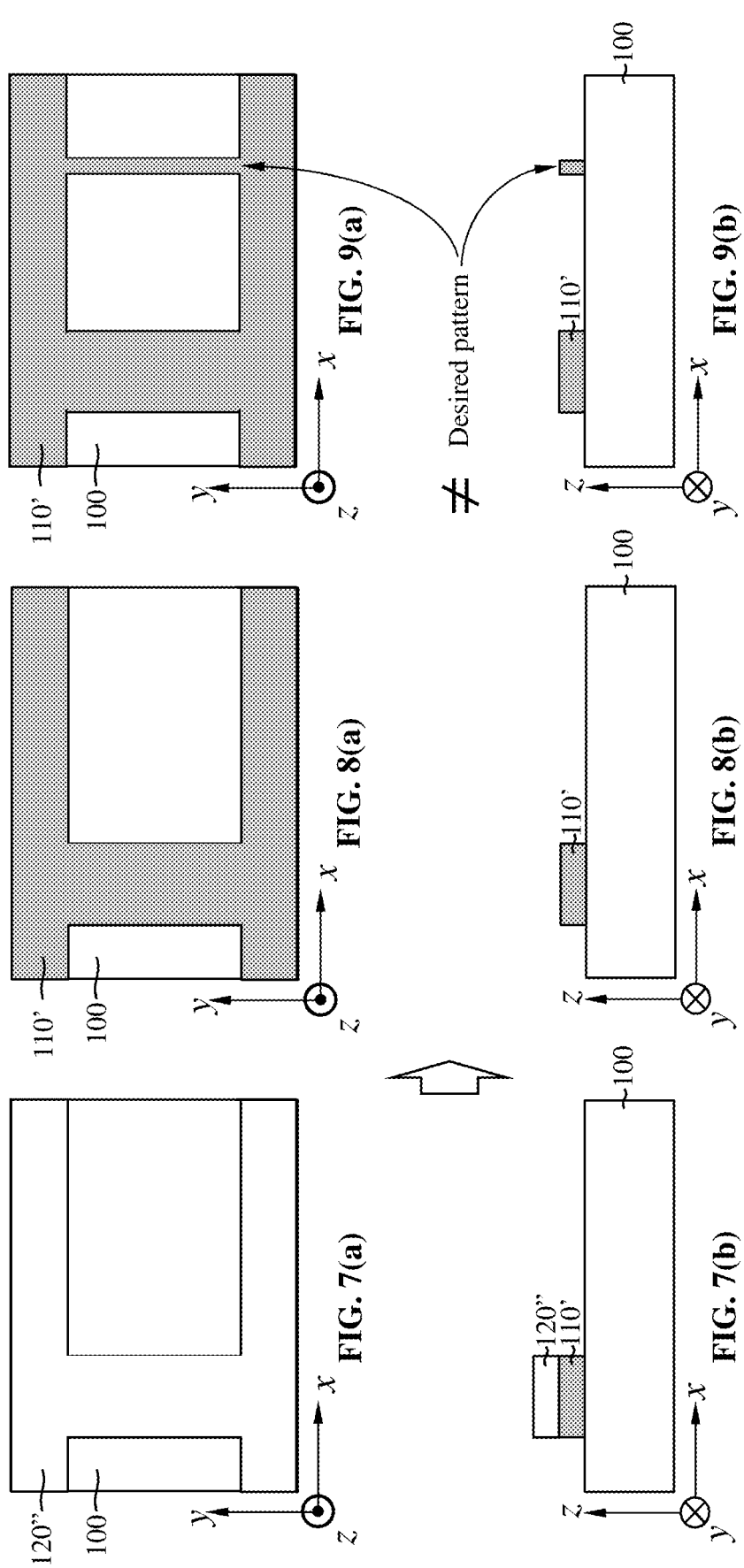

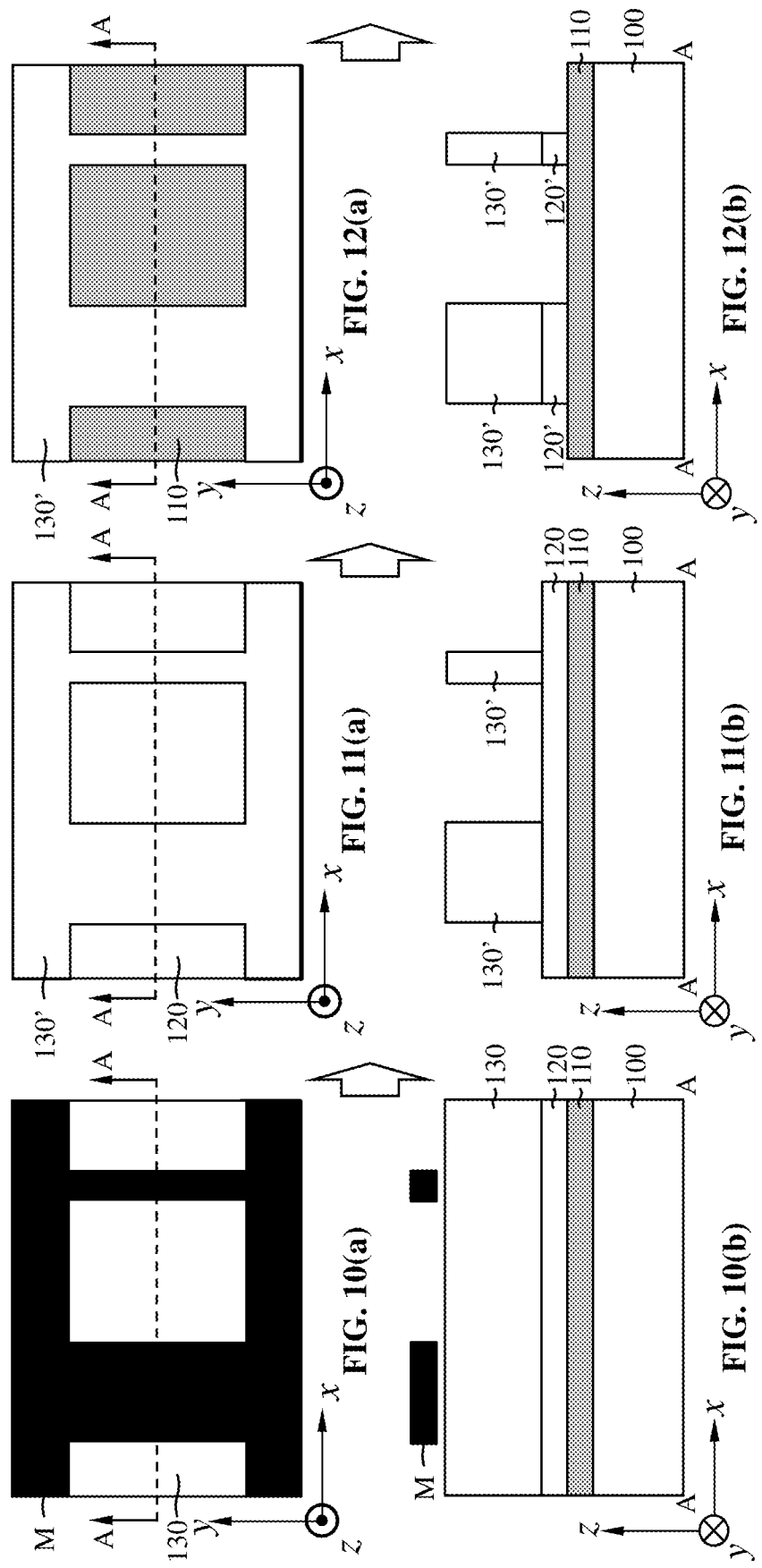

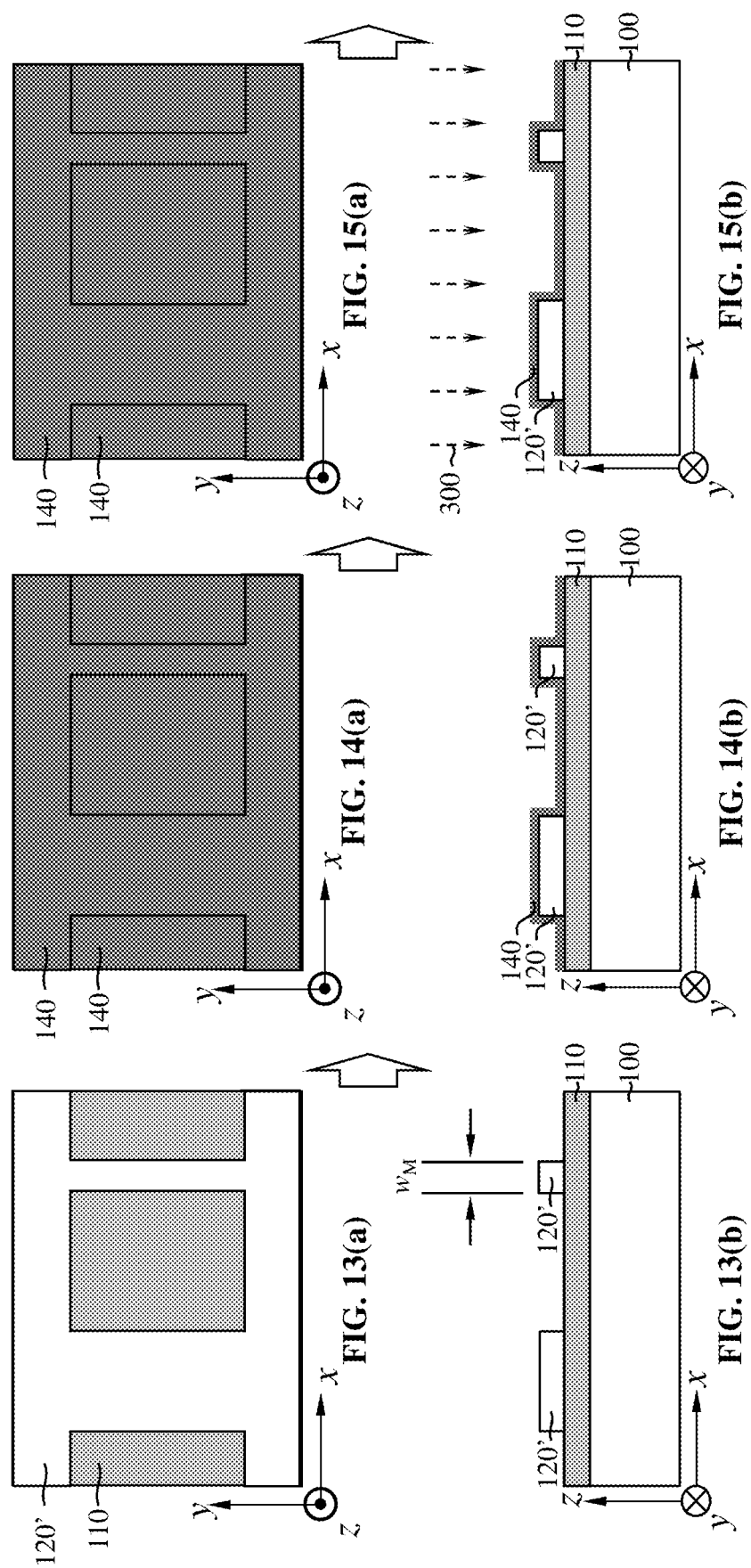

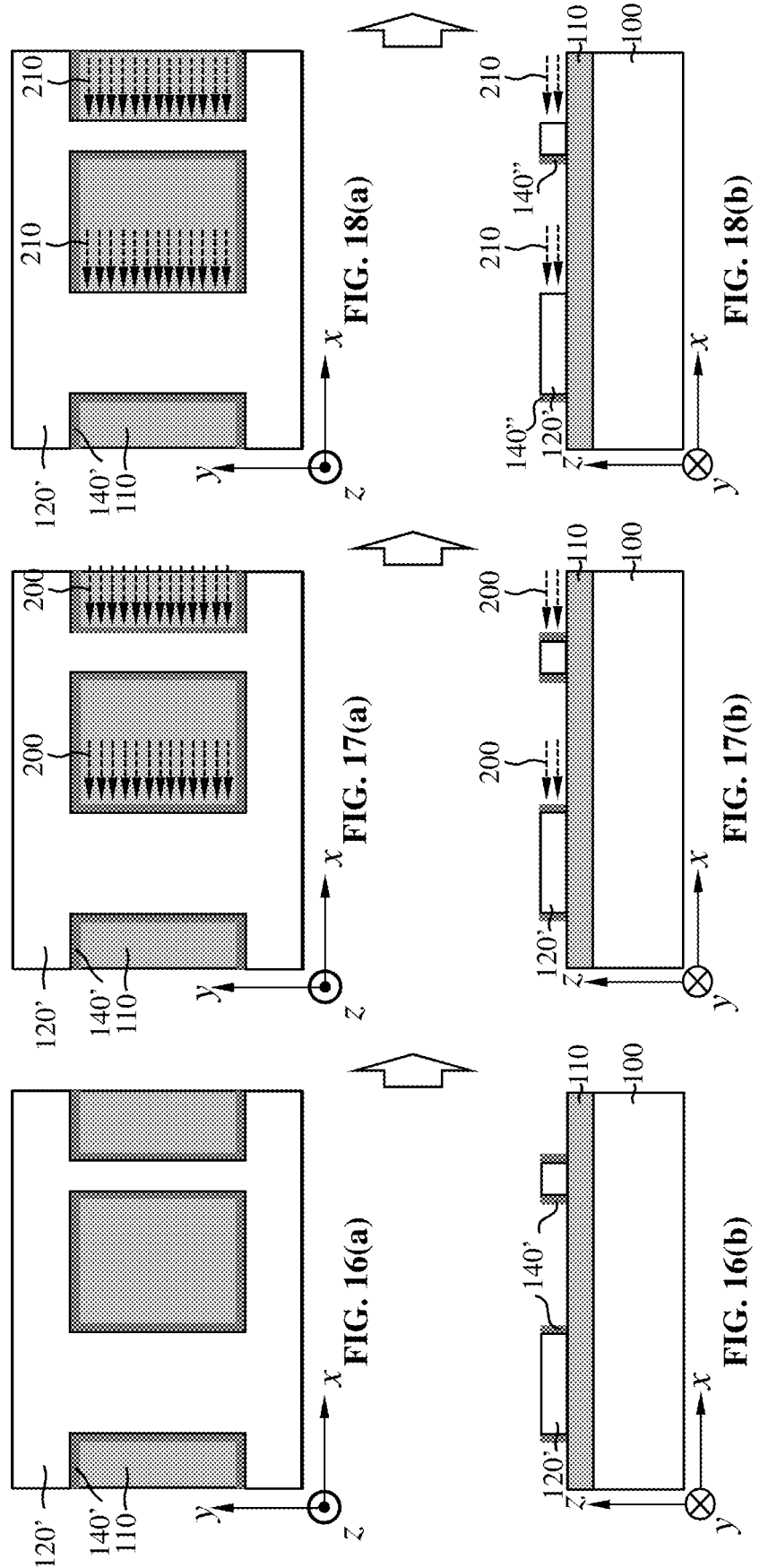

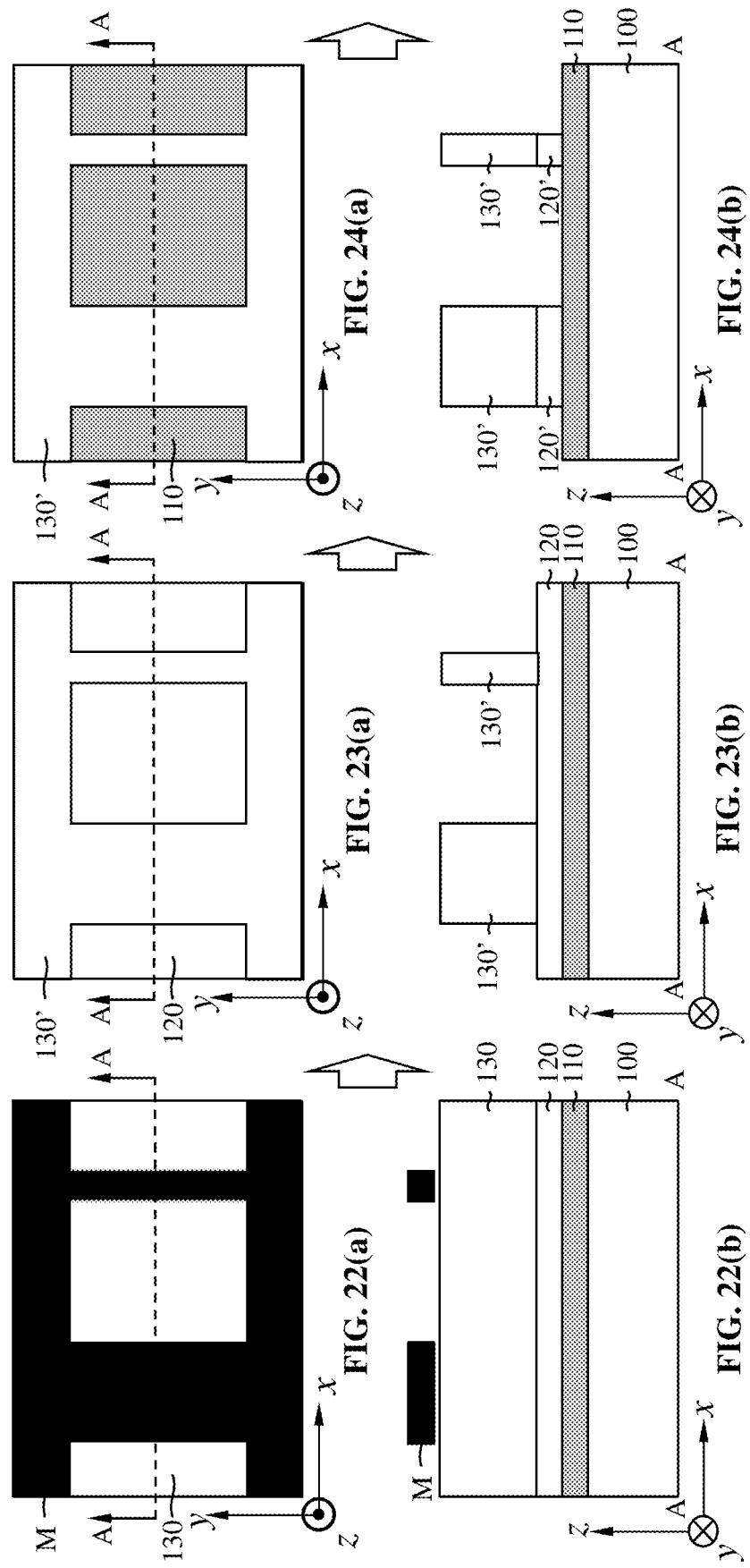

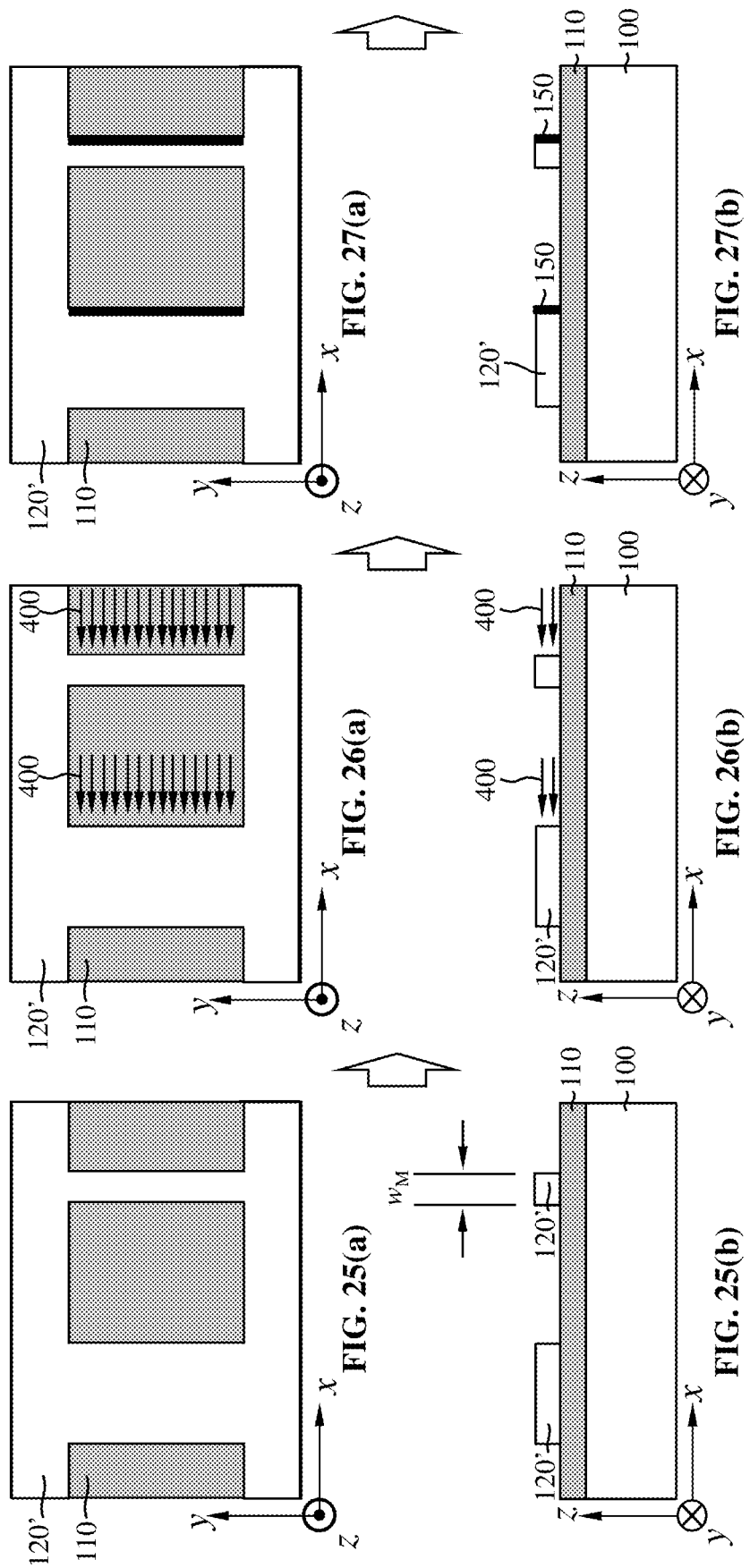

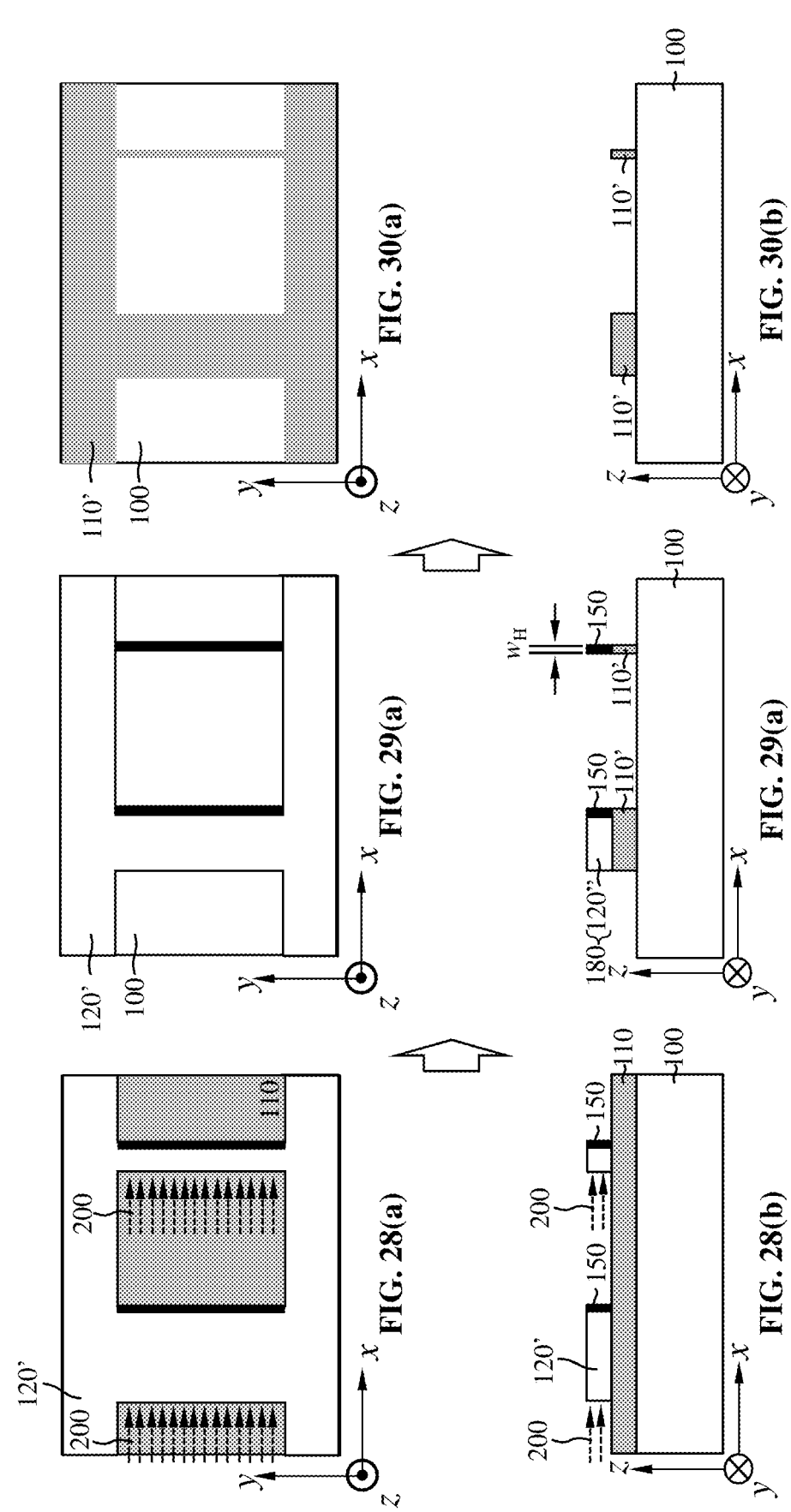

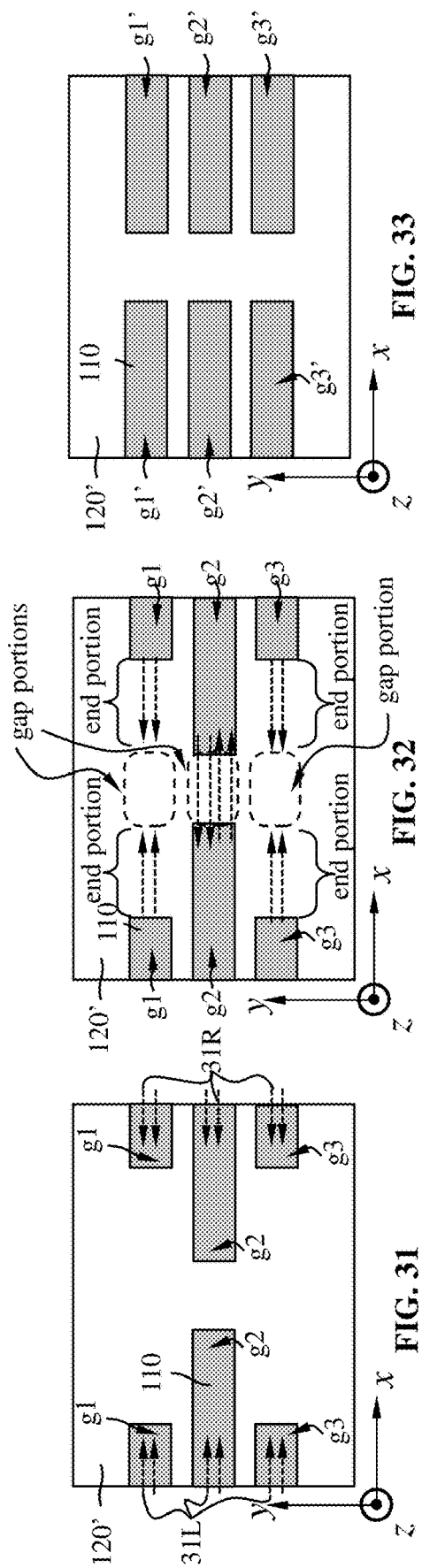

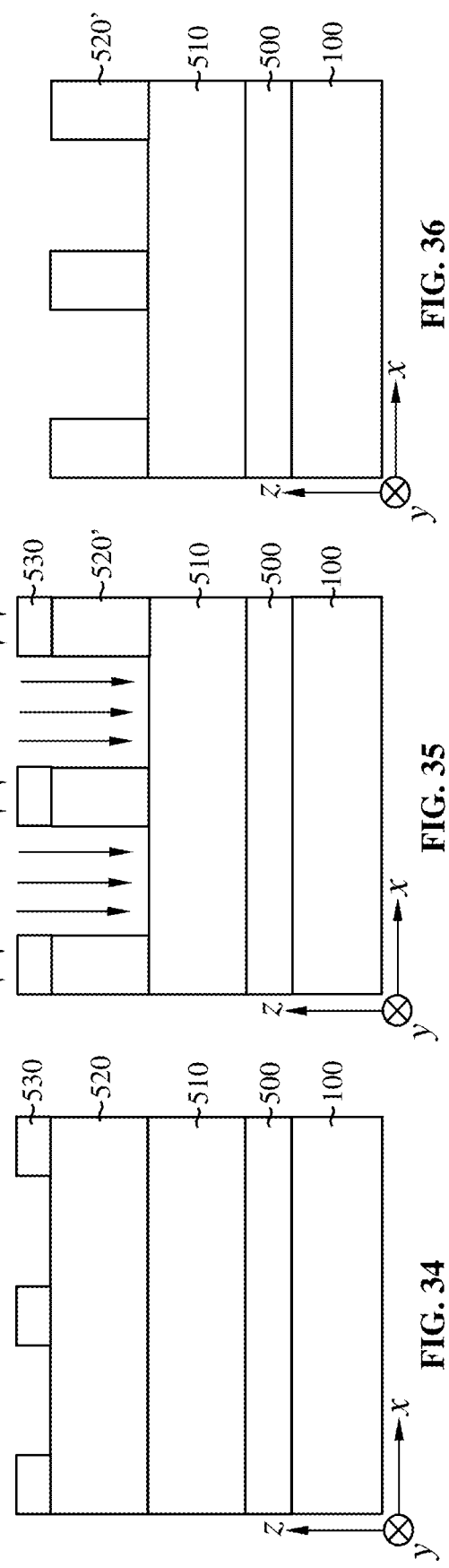
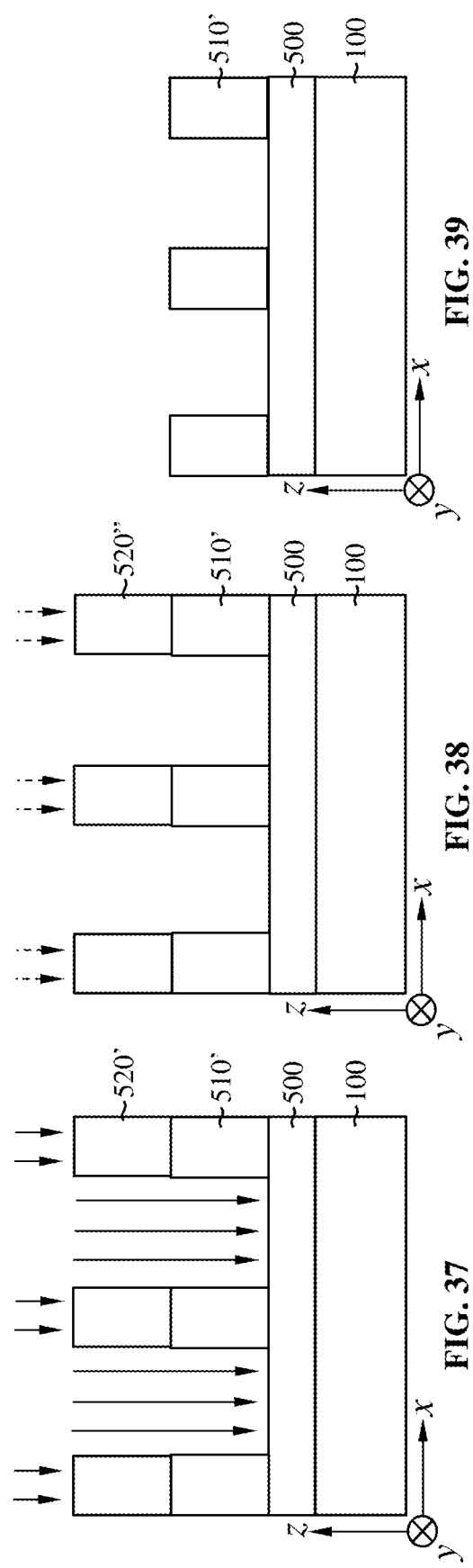

FINE LINE PATTERNING METHODS

RELATED APPLICATION

This application is a continuation of U.S. patent application Ser. No. 16/178,417 filed on Nov. 1, 2018, which claims priority of U.S. Provisional Patent Application No. 62/586,830 filed on Nov. 15, 2017, the entire contents of each of which are incorporated herein by reference.

TECHNICAL FIELD

The disclosure relates to fine line patterning methods. More specifically, the present disclosure relates to fine line patterning methods using directional etching methods and/or directional or bi-directional ion implantation methods to produce a patterned feature having an edge-to-edge or end-to-end distance within the patterned feature less than the minimum dimension achieved by lithography methods.

BACKGROUND

Along with the increasing demand of more powerful computing capability in devices, such as notebook computers, mobile phones, global positioning systems (GPS), and autonomous vehicle systems and higher resolution of full-spectrum display devices, such as mobile phone displays, TV panels, and computer screens, patterning techniques forming electronic circuits on a substrate wafer pushes the edge-to-edge or end-to-end (in short "EE") distance or length in a patterned line along a width direction in the patterned line to the lowest possible value. Traditionally, a sub-micron lithography technique and an etching method using a mask are used to form device/circuit patterns on a substrate wafer. The lithographic techniques use electromagnetic waves such as ultra violet (UV) photolithography, deep UV (DUV) photolithography, x-ray lithography, etc. The wavelengths pose a limit for the smallest dimension that can be formed through a gap of a mask. Other methods such as dip-pen lithography and electron beam lithography also pose a limit to the smallest dimension that can be formed. Since synthesized nanostructures (such as nanotube, nanorod, etc.) have a dimension that can be smaller than the smallest dimension of photolithographic methods, a bottom-up method by growing nanostructures on a substrate using a deposition method, such as such as chemical vapor deposition (CVD), including low pressure CVD (LPCVD) and plasma enhanced CVD (PECVD), atomic layer deposition (ALD), physical vapor deposition (PVD), such as pulsed laser deposition (PLD), sputtering, evaporative deposition, etc. can be used to form the nanostructures. However, manipulation of the formed nanostructures into aligned electronic devices on a substrate is very challenging and time consuming, and is thus usually carried out only in laboratory scale but not in industry scale. Therefore, there is a demand for a method that can be used to form fine line patterned with EE pushed to a new low level in industry scale.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1(*a*), 2(*a*), 3(*a*), 4(*a*), 5(*a*), 6(*a*), 7(*a*), and 8(*a*) show fragmentary diagrammatic top views of a semiconductor device, in portion or entirety, at various fabrication operations, according to an embodiment of the present disclosure. FIGS. 1(*b*), 2(*b*), and 3(*b*) show cross-sectional views along a cut line A-A on the semiconductor device shown in the top views of FIGS. 1(*a*), 2(*a*), and 3(*a*). FIGS. 4(*b*), 5(*b*), 6(*b*), 7(*b*), and 8(*b*) correspond to cross-sectional views of FIGS. 4(*a*), 5(*a*), 6(*a*), 7(*a*), and 8(*a*), respectively, however the cut line is not shown.

FIGS. 9(*a*) and 9(*b*) show a top view and a cross-sectional view of a semiconductor device with a desired pattern.

FIGS. 10(*a*), 11(*a*), 12(*a*), 13(*a*), 14(*a*), 15(*a*), 16(*a*), 17(*a*), 18(*a*), 19(*a*), 20(*a*), and 21(*a*) show fragmentary diagrammatic top views of a semiconductor device, in portion or entirety, at various fabrication operations, according to an embodiment of the present disclosure. FIGS. 10(*b*), 11(*b*), and 12(*b*) show cross-sectional views along a cut line A-A on the semiconductor device shown in the top views of FIGS. 10(*a*), 11(*a*), and 12(*a*). FIGS. 13(*b*), 14(*b*), 15(*b*), 16(*b*), 17(*b*), 18(*b*), 19(*b*), 20(*b*), and 21(*b*) correspond to cross-sectional views of FIGS. 13(*a*), 14(*a*), 15(*a*), 16(*a*), 17(*a*), 18(*a*), 19(*a*), 20(*a*), and 21(*a*), respectively, however the cut line is not shown.

FIGS. 22(*a*), 23(*a*), 24(*a*), 25(*a*), 26(*a*), 27(*a*), 28(*a*), 29(*a*), and 30(*a*) show fragmentary diagrammatic top views of a semiconductor device, in portion or entirety, at various fabrication operations, according to an embodiment of the present disclosure. FIGS. 22(*b*), 23(*b*), and 24(*b*) show cross-sectional views along a cut line A-A on the semiconductor device shown in the top views of FIGS. 22(*a*), 23(*a*), and 24(*a*). FIGS. 25(*b*), 26(*b*), 27(*b*), 28(*b*), 29(*b*), and 30(*b*) correspond to cross-sectional views of FIGS. 25(*a*), 26(*a*), 27(*a*), 28(*a*), 29(*a*), and 30(*a*), respectively, however the cut line is not shown.

FIGS. 31, 32, and 33 show fragmentary diagrammatic top views of a semiconductor device, in portion or entirety, at various fabrication operations, according to an embodiment of the present disclosure.

FIGS. 34, 35, 36, 37, 38, and 39 show cross-sectional views of a semiconductor device, at various fabrication operations, according to an embodiment of the present disclosure.

DETAILED DESCRIPTION

Figure 19A:
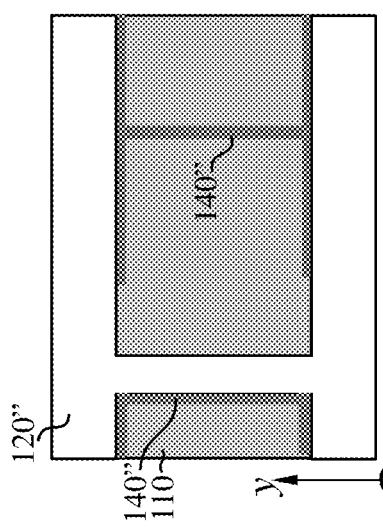

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

FIGS. 1(a), 1(b), 2(a), 2(b), 3(a), 3(b), 4(a), 4(b), 5(a), 5(b), 6(a), 6(b), 7(a), 7(b), 8(a), and 8(b) show various views illustrating various stages of a sequential manufacturing operation of a semiconductor device according to an embodiment of the present disclosure. It is understood that additional operations may be provided before, during, and after the operations shown by FIGS. 1(a)-8(b), and some of the operations described below can be replaced or eliminated for additional embodiments of the method. The order of the operations/processes may be interchangeable.

FIGS. 1(a) and 1(b) show a fragmentary diagrammatic top view and a cross-sectional view of a semiconductor device, in portion or entirety, at a fabrication operation, according to an embodiment of the present disclosure. FIGS. 1(a) and 1(b) show an operation of a photolithographic and etching method using a mask M over a substrate 100.

Depending on the device or integrated circuit (IC) being fabricated on the substrate 100, the substrate 100 can be made of various materials for proper functioning of the device or IC. In some embodiments, the substrate 100 includes a single crystalline semiconductor layer on at least its surface portion. The substrate 100 may include a single crystalline semiconductor material such as, but not limited to Si, Ge, SiGe, SiC, InSb, InP, InAs, InAlAs, InGaAs, GaAs, GaP, GaSb, GaSbP, and GaAsSb. In some embodiments, the substrate 100 is made of crystalline silicon. In some embodiments, the substrate 100 is a semiconductor-on-insulator substrate fabricated using separation by implantation of oxygen (SIMOX), wafer bonding, and/or other suitable methods, such as a silicon-on-insulator (SOI) substrate, a silicon germanium-on-insulator (SGOI) substrate, or a germanium-on-insulator (GOI) substrate.

In FIGS. 1(a) and 1(b), an underlying layer 110 is formed over the substrate 100.

Depending on the type and structure, the underlying layer can be made of the materials for proper functioning of a device made by patterning the underlying layer 110. In some embodiments, the underlying layer 110 is formed of a semiconductor material such as, but not limited to Si, SiGe and Ge. Bandgap adjustment in the semiconductor material of the underlying layer 110 is optionally performed to tune the carrier concentration in the underlying layer 110, and this is achieved using an ion implantation method, in some embodiments. Alternately, the underlying layer 110 is made of a conducting material including one or more of Co, Ni, W, Ti, Ta, Cu, Al, TiN and TaN for forming wiring lines of a circuitry or a device. The structure of the material in the underlying layer 110 is crystalline, polycrystalline, nano-structured, or two-dimensional sheet, in some embodiments. Also, in some embodiments, the underlying layer 110 is a portion of an integrated circuit (IC) chip, a system on chip (SoC), or portion thereof, that includes various passive and active microelectronic devices, such as resistors, multilayered capacitors, coil inductors, fuses, diodes, metal-oxide-semiconductor FETs (MOSFETs), complementary MOS (CMOS) transistors, FinFET, gate-all-around (GAA) FET and other suitable components, or combinations thereof. In other embodiments, the underlying layer 110 is one or more layers of a dielectric material, such as $SiO_2$, $Si_3N_4$, SiON, SiCN, or SiOCN.

In FIGS. 1(a) and 1(b), a hard mask layer 120 is formed over the substrate 100 and on the underlying layer 110. In some embodiments, the hard mask layer 120 is formed of a material such as, but not limited to, silicon oxide, silicon nitride, silicon carbide, or other suitable hard mask material, or combinations thereof. The hard mask layer 120 is formed by a deposition process, such as chemical vapor deposition (CVD), including low pressure CVD (LPCVD) and plasma enhanced CVD (PECVD), physical vapor deposition (PVD), atomic layer deposition (ALD), or other suitable process.

On the hard mask layer 120, a photoresist layer 130 is formed by spin coating or self-assembly, in some embodiments. The photoresist layer 130 is a positive resist (a type of photoresist in which the portion of the photoresist that is exposed to light becomes soluble in the photoresist developer and the unexposed portion of the photoresist remains insoluble in the photoresist developer) or a negative photoresist (a type of photoresist in which the portion of the photoresist that is exposed to light becomes insoluble in the photoresist developer and the unexposed portion of the photoresist is dissolved by the photoresist developer).

In some embodiments, operations of pre-exposure baking, exposure, post-exposure baking, and development are carried on at the photoresist layer 130. The operation of exposure uses an electromagnetic wave or energetic particles having a wavelength of any value that can change the chemical structure of the photoresist layer 130. The exposure source includes high-pressure mercury lamp with a wavelength of about 436 nm (g-line) and a wavelength of about 365 nm (i-line), deep UV (DUV) with wavelengths of about 248 nm (KrF laser) and about 193 nm (ArF laser), and extreme UV (EUV) with a wavelength in a range from about 10 nm to about 15 nm, e-beam, and X-ray. The electromagnetic wave or energetic particle passes through transparent portions or openings of the mask M and reaches the photoresist layer 130 in some embodiments. In some embodiments, EUV is not included. In some embodiments, maskless photolithography is used and the electromagnetic wave or energetic particles form a pattern by controlled optical or electromagnetic system (in case of e-beam) on the photoresist layer 130 without using a mask, and in this method, the precision of patterning relies solely on the electro-magnetic optics instead of the mask. In some embodiments, other techniques are used to form a pattern on the photoresist layer 130, and the techniques include cyclotron photolithography, atomic force microscopic (AFM) cantilever writing or positron beam photolithography.

FIGS. 2(a) and 2(b) show the structure after the operation of development of the photoresist layer 130 is performed. Depending on the material of the photoresist layer, the exposed and developed region of the photoresist layer can either be removed by dissolution to show the desired pattern, or remain as the desired patterns. The patterned photoresist layers 130' are formed on the hard mask layer 120, duplicating the pattern provided by the shape of the mask M in FIGS. 1(a) and 1(b).

FIGS. 3(a) and 3(b) show that an etching operation is performed on the hard mask layer 120 using the developed photoresist layer 130' as an etching mask, to form patterned hard mask layer 120'. FIGS. 4(a) and 4(b) show the structure after the patterned photoresist layer 130' is removed. In some embodiments, the patterned photoresist layer 130' is removed by a plasma ashing operation or a wet removal process.

FIGS. 5(a) and 5(b) show an operation of directional etching of the patterned hard mask layer 120' from a right to left direction (i.e. in x-direction). The directional etching or surface directional etching process (also referred to as a horizontal directional etching process) is performed to modify a horizontal profile of the patterned hard mask layer 120' so as to reduce an edge-to-edge or end-to-end (EE) distance within a feature in the patterned hard mask layer 120'. The directional etching method increases the gap between the left and right vertical patterns in FIG. 5(a) by an extended gap region having a width of d (FIG. 6(a)). Also, the directional etching method narrows the left pattern of the patterned hard mask layer 120' by reducing a portion having a width of d (FIG. 6(a)). For a narrow feature, such as the right pattern in FIG. 5(a), it can be selectively and completely removed without and with minimal effect to the other portions of the patterned hard mask layer 120' adjacent to this removed narrow feature. The surface directional etching process is a selective dry etching process that selectively etches the patterned hard mask layer 120' relative to substrate 100. The selective dry etching process directs an etching species or energetic species in a substantially horizontal direction relative to a horizontal surface of substrate 100, thereby achieving horizontal etching of patterned hard mask layer 120'. In this disclosure, the substantially horizontal direction generally refers to a situation where the etching species or energetic species are directed towards a horizontal surface of substrate 100 at an angle of about 0° to about 20° relative to the horizontal surface in the x-y plane substantially parallel to the horizontal surface of the substrate. In some embodiments, the angle is less than or equal to about 10°. Depending on the desired horizontal etching, the angle can be tuned to different values. In some embodiments, the angle can be adjusted so that the etching species or energetic species are along the x axis, y axis, or z axis. In some embodiments, the surface directional etching process is a plasma etching process tuned to cause plasma to flow in an in-plane direction, such as along the y axis, over substrate 100, such that horizontal profile of gap between the left and right patterns in FIG. 5(a) are modified in the y axis direction.

Various etching parameters can be tuned to generate etching species (radicals) that travel in a horizontal direction, such as etchant composition, etching temperature, etching time, etching pressure, radio frequency (RF) bias voltage, RF bias power, etchant flow rate, wafer tilting, other suitable etching parameters, or combinations thereof. In some embodiments, RF bias voltage is tuned to achieve an electric field that causes etching species to flow substantially horizontally along an in-plane direction (for example, in the y axis direction) relative to a surface over substrate 100. In some embodiments, the etching species are tuned to have a profile of momenta of the energetic species such as the momenta of the etching species or energetic species along a frontline are not the same, i.e. the momentum of an etching or energetic species on the top path is different from the momentum of an etching or energetic species on the bottom path. In some embodiments, the momentum of an etching or energetic species on the top path is different from the momentum of an etching or energetic species in the middle path above the bottom path, and the momentum of the etching or energetic species on the top path is the same as or different from the momentum of an etching or energetic species on the bottom path. Any combinations can be achieved by adjustment of the electromagnetic control to tune the energies of the etching or energetic species along the etching front.

FIGS. 6(a) and 6(b) show the outcome of the patterned hard mask layer 120' after the directional etching operation performed in FIGS. 5(a) and 5(b). FIGS. 9(a) and 9(b) show the expected and desired final pattern of the underlying layer 110', when the directional etching on the hard mask layer 120" is well-controlled. In contrast, FIGS. 6(a) and 6(b) show the case where the directional etching is not appropriately controlled. The width of the left pattern of the patterned hard mask layer 120' is reduced by a distance d while the right thinner hard mask pattern of the patterned hard mask layer 120' in FIGS. 5(a) and 5(b), which is expected to be smaller and non-zero after the directional etching operation performed in FIGS. 5(a) and 5(b), is undesirably and completely removed after the directional etching operation. Therefore, a new strategy or method may apply directional etching to make a narrow hard mask pattern narrower to achieve a fine dimension by etching through the narrowed and patterned hard mask layer 120' smaller than the smallest value achieved by photolithography.

FIGS. 7(a) and 7(b) show the operation using the directionally etched hard mask layer 120" for etching the underlying layer 110'. In some embodiments, the underlying layer 110' is etched to form a pattern based on the directionally etched hard mask layer 120".

FIGS. 8(a) and 8(b) show an operation of removing the directionally etched hard mask layer 120". In FIGS. 8(a) and 8(b), the patterned underlying layer 110' remains.

FIGS. 9(a) and 9(b) show the expected and desired final pattern of the underlying layer 110' which is not equal to the final outcome of the patterned underlying layer 110' shown in FIGS. 8(a) and 8(b). In particular, the desired right narrower pattern in FIGS. 9(a) and 9(b) is undesirably and completely removed in FIGS. 8(a) and 8(b). A new strategy or method may achieve a fine line pattern that has a pattern width or EE distance smaller than the smallest dimension achieved by a photolithographic and etching method.

FIGS. 10(a)-21(b) show various views illustrating various stages of a sequential manufacturing operation of a semiconductor device according to an embodiment of the present disclosure. It is understood that additional operations may be provided before, during, and after the operations shown by FIGS. 10(a)-21(b), and some of the operations described below can be replaced or eliminated for additional embodiments of the method. The order of the operations/processes may be interchangeable. Materials, configurations, layouts, dimensions, processes and/or operations same as or similar to those described with respect to FIGS. 1(a)-9(b) may be employed in the following embodiments and the detailed explanation may be omitted.

FIGS. 10(a)-20(b) show operations of forming a fine line pattern that has a dimension smaller than the smallest dimension achieved by a photolithographic and etching method.

FIGS. 10(a) and 10(b) show a fragmentary diagrammatic top view and a cross-sectional view of a semiconductor device, in portion or entirety, at various fabrication operations, according to an embodiment of the present disclosure. FIGS. 10(a) and 10(b) show an operation of a photolithographic and etching method using a mask M over a substrate 100. Depending on the device or integrated circuit (IC)

being fabricated on the substrate 100, the substrate 100 can be made of various materials for proper functioning of the device or IC. In some embodiments, the substrate 100 includes a single crystalline semiconductor layer on at least its surface portion. The substrate 100 may include a single crystalline semiconductor material such as, but not limited to Si, Ge, SiGe, SiC, InSb, InP, InAs, InAlAs, InGaAs, GaAs, GaP, GaSb, GaSbP, and GaAsSb. In some embodiments, the substrate 100 is made of crystalline silicon. In some embodiments, the substrate 100 is a semiconductor-on-insulator substrate fabricated using separation by implantation of oxygen (SIMOX), wafer bonding, and/or other suitable methods, such as a silicon-on-insulator (SOI) substrate, a silicon germanium-on-insulator (SGOI) substrate, or a germanium-on-insulator (GOI) substrate.

In FIGS. 10(a) and 10(b), an underlying layer 110 is formed over the substrate 100. Depending on the type and structure, the underlying layer can be made of materials for proper functioning of a device made by patterning the underlying layer 110. In some embodiments, the underlying layer 110 is formed of a semiconductor material such as, but not limited to Si, SiGe and Ge. Bandgap adjustment in the semiconductor material of the underlying layer 110 is optionally performed to tune the carrier concentration in the underlying layer 110, and this is achieved using an ion implantation method, in some embodiments. Alternately, the underlying layer 110 is made of a conducting material including one or more of Co, Ni, W, Ti, Ta, Cu, Al, TiN and TaN for forming wiring lines of a circuitry or a device. The structure of the material in the underlying layer 110 is crystalline, polycrystalline, nanostructured, and two-dimensional sheet, in some embodiments. Also, in some embodiments, the underlying layer 110 is a portion of an integrated circuit (IC) chip, a system on chip (SoC), or portion thereof, that includes various passive and active microelectronic devices, such as resistors, multilayered capacitors, coil inductors, fuses, diodes, metal-oxide-semiconductor FETs (MOSFETs), complementary MOS (CMOS) transistors, FinFET, gate-all-around (GAA) FET and other suitable components, or combinations thereof. In other embodiments, the underlying layer 110 is one or more layers of dielectric material, such as $SiO_2$, $Si_3N_4$, SiON, SiCN, or SiOCN.

In FIGS. 10(a) and 10(b), a hard mask layer 120 is formed over the substrate 100 and on the underlying layer 110. In some embodiments, the hard mask layer 120 is formed of a material such as, but not limited to, silicon oxide, silicon nitride, silicon carbide, or other suitable hard mask material, or combinations thereof. The hard mask layer 120 is formed by a deposition process such as chemical vapor deposition (CVD), including low pressure CVD (LPCVD) and plasma enhanced CVD (PECVD), physical vapor deposition (PVD), atomic layer deposition (ALD), or other suitable process.

On the hard mask layer 120, a photoresist layer 130 is formed by spin coating or self-assembly, in some embodiments. The photoresist layer 130 is a positive resist (a type of photoresist in which the portion of the photoresist that is exposed to light becomes soluble in the photoresist developer and the unexposed portion of the photoresist remains insoluble in the photoresist developer) or a negative photoresist (a type of photoresist in which the portion of the photoresist that is exposed to light becomes insoluble in the photoresist developer and the unexposed portion of the photoresist is dissolved by the photoresist developer).

In some embodiments, operations of pre-exposure baking, exposure, post-exposure baking, and development are carried out on the photoresist layer 130. The operation of exposure uses an electromagnetic wave having a wavelength of any value that can change the chemical structure of the photoresist layer 130 or energetic particles. The exposure source includes high-pressure mercury lamp with a wavelength of about 436 nm g-line and a wavelength of about 365 nm UV, deep UV (DUV) with wavelengths of about 248 nm (KrF laser) and about 193 nm (ArF laser), and extreme UV (EUV) with a wavelength in a range from about 10 nm to about 15 nm, e-beam, and X-ray. The electromagnetic wave or energetic particle passes through transparent portions or openings of the mask M and reaches the photoresist layer 130 in some embodiments. In some embodiments, maskless photolithography is used and electromagnetic wave of energetic particles form a pattern by controlled optical or electromagnetic system (in case of e-beam) on the photoresist layer 130 without using a mask, and in this method, the precision of patterning relies solely on the electro-magnetic optics instead of a mask. In some embodiments, other techniques are used to form a pattern on the photoresist layer 130, and the techniques include cyclotron photolithography, atomic force microscopic (AFM) cantilever writing or positron beam photolithography.

FIGS. 11(a) and 11(b) show the structure after the operation of development of the photoresist layer 130 is performed. Depending on the material of the photoresist layer 130, the exposed and developed region of the photoresist layer can either be removed by dissolution to show the desired pattern or remain as desired patterns. The patterned photoresist layers 130' are formed on the hard mask layer 120, duplicating the pattern provided by the shape of the mask M in FIGS. 10(a) and 10(b).

FIGS. 12(a) and 12(b) show an etching operation performed on the hard mask layer 120 using the developed photoresist layer 130' as an etching mask, to form patterned hard mask layer 120'. FIGS. 13(a) and 13(b) show the structure of the patterned photoresist layer 130' on the patterned hard mask layer 120' is removed. In some embodiments, the patterned photoresist layer 130' is removed by a plasma ashing operation or a wet removal process. The remaining patterned hard mask layer 120' has a width or edge-to-edge or end-to-end length (in short "EE") of $w_M$. This value of EE, $w_M$, is further reduced in the following operations.

FIGS. 14(a) and 14(b) show an operation of forming a blanket layer of a spacer material 140 over the substrate 100, covering the patterned hard mask layer 120'. In some embodiments, the spacer material layer 140 is formed of one or more of insulating materials, such as $SiO_2$, $Al_2O_3$, $HfO_2$ or silicon oxynitride and the spacer material layer 140 is selectively etchable relative to the hard mask layer 120.

FIGS. 15(a) and 15(b) show an operation of anisotropic etching 300 to remove the spacer material layer 140 on the substrate 100. In some embodiments, the spacer material layer 140 is etched to remove the spacer material from horizontal surfaces while the vertical sections of the spacer material 140 remain. In some embodiments, such an etching process is performed using a reactive ion etch (RIE) employing $CF_4$, $CHF_3$, and/or $CH_2F_2$-containing plasma in the case of $SiO_2$ spacer material. The etching chemistry may be selective to the material comprising the spacer material layer 140. In some embodiments, single anisotropic etching is performed. In other embodiments, multiple anisotropic etching is performed.

FIGS. 16(a) and 16(b) show the outcome of the anisotropic etching in FIGS. 15(a) and 15(b). The patterned spacer material layer 140' contact sidewalls of the patterned hard mask layer 120' while the horizontal sections of the spacer material layer 140 are substantially removed.

FIGS. 17(*a*) and 17(*b*) show an operation of a directional etching 200 from the right-to-left direction to remove the right vertical section of the spacer material layer 140' contacting the right sidewalls of the patterned hard mask layer 120'. The purpose of the directional etching is to expose the surface of the right sidewalls of the patterned hard mask layer 120'. In some embodiments, such an etching process is performed using a reactive ion etch (RIE) employing $CF_4$, $CHF_3$, and/or $CH_2F_2$-containing plasma in the case of $SiO_2$ spacer material. The etching chemistry may be selective to the material comprising the spacer material layer 140. In some embodiments, single anisotropic etching is performed. In other embodiments, multiple anisotropic etching is performed.

The etching operation of FIGS. 17(*a*) and 17(*b*) is directional etching or surface directional etching process (also referred to as a horizontal directional etching process) performed to eventually modify a horizontal profile of the hard mask features of patterned hard mask layer 120' so as to reduce an edge-to-edge or end-to-end (EE) distance within a feature in the patterned hard mask layer 120' when combined with the etching operation of FIGS. 18(*a*) and 18(*b*). The directional etching method in FIGS. 17(*a*) and 17(*b*) increases the gap between the left and right vertical patterns in FIG. 17(*a*) by removing the right spacer material layer 140' (the outcome of the etching operation of FIGS. 17(*a*) and 17(*b*) is shown in FIGS. 18(*a*) and 18(*b*)). The surface directional etching process is a selective dry etching process that selectively etches the spacer material layer 140'. The selective dry etching process directs an etching species or energetic species in a substantially horizontal direction relative to a horizontal surface of substrate 100, thereby achieving horizontal etching of the spacer material layer 140'. In this disclosure, the substantially horizontal direction generally refers to the etching species or energetic species being directed towards a horizontal surface of substrate 100 at an angle of about 0° to about 20° relative to the horizontal surface in the x-y plane (substantially parallel to the horizontal surface of the substrate). In some embodiments, the angle is less than or equal to about 10°. Depending on desired horizontal etching, the angle can be tuned to different values. In some embodiments, the angle can be adjusted so that the etching species or energetic species are along the x axis, y axis, or z axis. In some embodiments, the surface directional etching process is a plasma etching process tuned to cause plasma to flow in an in-plane direction, such as along the y axis, over substrate 100, such that horizontal profile of gap between the left and right patterns in FIG. 17(*a*) are modified in the y axis direction.

Various etching parameters can be tuned to generate etching species (radicals) that travel in a horizontal direction, such as etchant composition, etching temperature, etching time, etching pressure, radio frequency (RF) bias voltage, RF bias power, etchant flow rate, wafer tilting, other suitable etching parameters, or combinations thereof. In some embodiments, RF bias voltage is tuned to achieve an electric field that causes etching species to flow substantially horizontally along an in-plane direction (for example, in the y axis direction) relative to a surface over substrate 100. In some embodiments, the etching species are tuned to have a profile of momenta of the energetic species such as the momenta of the etching species or energetic species along a frontline are not the same, i.e. the momentum of an etching or energetic species on the top path is different from the momentum of an etching or energetic species on the bottom path. In some embodiments, the momentum of an etching or energetic species on the top path is different from the momentum of an etching or energetic species in the middle path above the bottom path, and the momentum of the etching or energetic species on the top path is the same as or different from the momentum of an etching or energetic species on the bottom path. Any combinations can be achieved by adjustment of the electromagnetic control to tune the energies of the etching or energetic species along the etching front.

After the directional etching of the spacer material layer 140', another directional etching operation 210 targeting the exposed sidewall surface of the patterned hard mask layer 120' is shown in FIGS. 18(*a*) and 18(*b*). FIGS. 18(*a*) and 18(*b*) show that the energetic species of the directional etching method are aimed at the right sidewall surface of the hard mask layer 120'. The etchant targets the hard mask layer 120' instead of the spacer material layer 140'. The etchant source gas includes a fluorine containing gas without oxygen, in some embodiments. In another embodiment, the etchant source gas also includes argon. The etching operation of FIGS. 18(*a*) and 18(*b*) is directional etching or surface directional etching process (also referred to as a horizontal directional etching process) performed to directly modify a horizontal profile of the hard mask features of patterned hard mask layer 120' so as to reduce an edge-to-edge or end-to-end (EE) distance within a feature in the patterned hard mask layer 120'. The directional etching method in FIGS. 18(*a*) and 18(*b*) removes the right vertical portion of the 120' while the spacer material layer 140" remains (the outcome of the etching operation of FIGS. 18(*a*) and 18(*b*) is shown in FIGS. 19(*a*) and 19(*b*)). The surface directional etching process is a selective dry etching process that selectively etches the hard mask layer 120'. The selective dry etching process directs an etching species or energetic species in a substantially horizontal direction relative to a horizontal surface of substrate 100, thereby achieving horizontal etching of the hard mask layer 120'. In this disclosure, the substantially horizontal direction generally refers to the etching species or energetic species being directed towards a horizontal surface of substrate 100 at an angle of about 0° to about 20° relative to the horizontal surface in the x-y plane (substantially parallel to the horizontal surface of the substrate). In some embodiments, the angle is less than or equal to about 10°. Depending on desired horizontal etching, the angle can be tuned to different values. In some embodiments, the angle can be adjusted so that the etching species or energetic species are along the x axis, y axis, or z axis. In some embodiments, the surface directional etching process is a plasma etching process tuned to cause plasma to flow in an in-plane direction, such as along the y axis, over substrate 100.

Various etching parameters can be tuned to generate etching species (radicals) that travel in a horizontal direction, such as etchant composition, etching temperature, etching time, etching pressure, radio frequency (RF) bias voltage, RF bias power, etchant flow rate, wafer tilting, other suitable etching parameters, or combinations thereof. In some embodiments, RF bias voltage is tuned to achieve an electric field that causes etching species to flow substantially horizontally along an in-plane direction (for example, in the y axis direction) relative to a surface over substrate 100. In some embodiments, the etching species are tuned to have a profile of momenta of the energetic species such as the momenta of the etching species or energetic species along a frontline are not the same, i.e. the momentum of an etching or energetic species on the top path is different from the momentum of an etching or energetic species on the bottom path. In some embodiments, the momentum of an etching or energetic species on the top path is different from the momentum of an etching or energetic species in the middle path above the bottom path, and the momentum of the etching or energetic species on the top path is the same as or different from the momentum of an etching or energetic species on the bottom path. Any combinations can be achieved by adjustment of the electromagnetic control to tune the energies of the etching or energetic species along the etching front.

The etching parameter such as degree of etching direction is controlled to the same for both operations in FIGS. 17(a) and 17(b) and FIGS. 18(a) and 18(b), in some embodiments. In other embodiments, the etching parameter such as degree of etching direction is controlled to be different for both operations in FIGS. 17(a) and 17(b) and FIGS. 18(a) and 18(b).

Figure 19B:
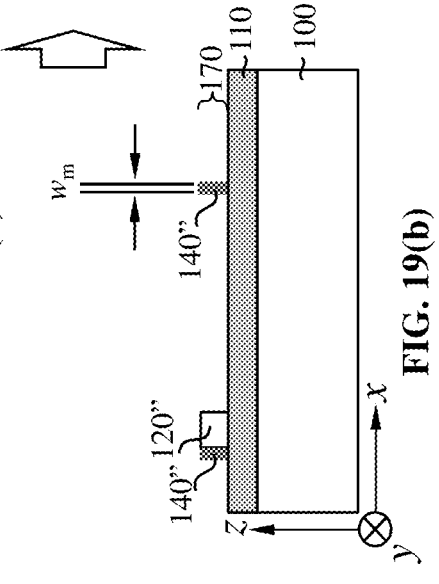

FIGS. 19(a) and 19(b) show the outcome of the directional etching performed in FIGS. 18(a) and 18(b). FIGS. 19(a) and 19(b) show that the left pattern of the patterned hard mask layer 120' is narrowed while the right pattern of the patterned hard mask layer 120' is completely removed, while the spacer material layer 140' after this directional etching operation of the exposed hard mask layer 120' remains, forming patterned spacer material layer 140'' with opposite sidewalls exposed.

Figure 20A:
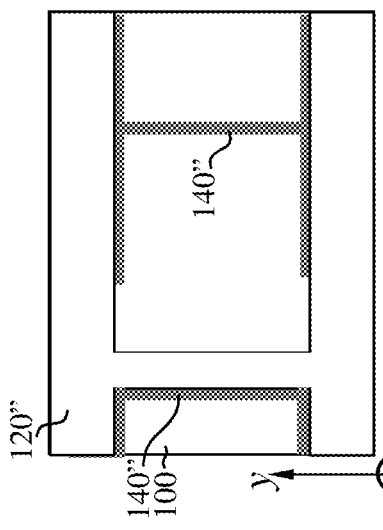
Figure 21A:
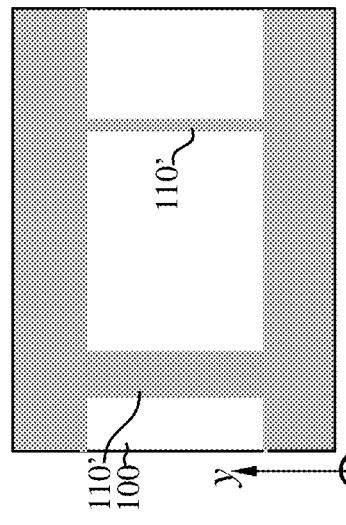
Figure 20B:
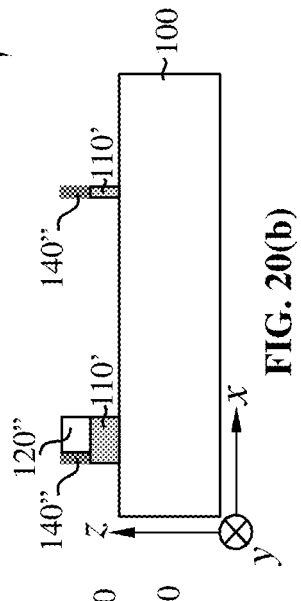
Figure 21B:
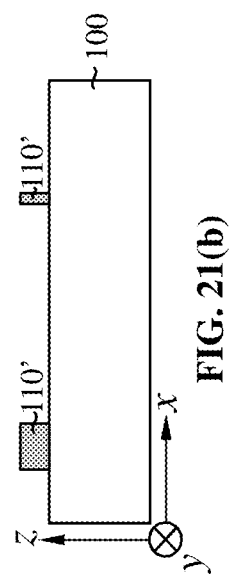

FIGS. 20(a) and 20(b) show an operation of etching using the patterned spacer material layer 140''. In some embodiments, the etching is performed by anisotropic etching methods. After the underlying layer 110 is patterned, the patterned spacer material layers 140'' are removed by dry and/or wet etching (FIGS. 21(a) and 21(b)). The right pattern of the patterned underlying layer 110' has a dimension of the patterned spacer material layer 140'', and has an EE length smaller than the smallest value achieved by other photolithographic and etching methods. The width of the patterned spacer material layer 140'' can be adjusted by adjusting a thickness of the blanket layer 140 of the spacer material. In some embodiments, the thickness of the blanket layer 140 of the spacer material is in a range from about 5 nm to about 20 nm and the width $w_m$ of the patterned spacer material layer 140'' (labelled in FIG. 19(b)) is in a range from about 3 nm to about 18 nm, in some embodiments. In some embodiments, the width $w_m$ is in a range of 0.5 nm to 5 nm.

Additional steps can be provided before, during, and after the operations of FIGS. 10(a), 10(b), 11(a), 11(b), 12(a), 12(b), 13(a), 13(b), 14(a), 14(b), 15(a), 15(b), 16(a), 16(b), 17(a), 17(b), 18(a), 18(b), 19(a), 19(b), 20(a), 20(b), 21(a), and 21(b), and some of the operations described can be removed, replaced, or eliminated for additional embodiments. Combinations of any of the operations in this disclosure can be performed for other possible embodiments in this disclosure.

FIGS. 22(a), 22(b), 23(a), 23(b), 24(a), 24(b), 25(a), 25(b), 26(a), 26(b), 27(a), 27(b), 28(a), 28(b), 29(a), 29(b), 30(a), and 30(b) show various views illustrating various stages of a sequential manufacturing operation of a semiconductor device according to an embodiment of the present disclosure. It is understood that additional operations may be provided before, during, and after the operations shown by FIGS. 22(a)-30(b), and some of the operations described below can be replaced or eliminated for additional embodiments of the method. The order of the operations/processes may be interchangeable.

FIGS. 22(a), 22(b), 23(a), 23(b), 24(a), 24(b), 25(a), 25(b), 26(a), 26(b), 27(a), 27(b), 28(a), 28(b), 29(a), 29(b), 30(a), and 30(b) show operations of forming a patterned underlying layer having a dimension or EE length smaller than the smallest dimension achieved by photolithographic and etching methods, without using the spacer material layer 140 and the operations applied to the spacer material layer 140 in FIGS. 14(a), 14(b), 15(a), 15(b), 16(a), 16(b), 17(a), 17(b), 18(a), 18(b), 19(a), 19(b), 20(a), and 20(b).

FIGS. 22(a) and 22(b) show a fragmentary diagrammatic top view and a cross-sectional view of a semiconductor device, in portion or entirety, at a fabrication operation, according to an embodiment of the present disclosure. FIGS. 22(a) and 22(b) show an operation of a photolithographic and etching method using a mask M over a substrate 100. Depending on the device or integrated circuit (IC) being fabricated on the substrate 100, the substrate 100 can be made of various materials for proper functioning of the device or IC. In some embodiments, the substrate 100 includes a single crystalline semiconductor layer on at least its surface portion. The substrate 100 may include a single crystalline semiconductor material such as, but not limited to Si, Ge, SiGe, SiC, InSb, InP, InAs, InAlAs, InGaAs, GaAs, GaP, GaSb, GaSbP, and GaAsSb. In some embodiments, the substrate 100 is made of crystalline silicon. In some embodiments, the substrate 100 is a semiconductor-on-insulator substrate fabricated using separation by implantation of oxygen (SIMOX), wafer bonding, and/or other suitable methods, such as a silicon-on-insulator (SOI) substrate, a silicon germanium-on-insulator (SGOI) substrate, or a germanium-on-insulator (GOI) substrate.

In FIGS. 22(a) and 22(b), an underlying layer 110 is formed over the substrate 100. Depending on the type and structure, the underlying layer can be made of materials for proper functioning of a device made by patterning the underlying layer 110. In some embodiments, the underlying layer 110 is formed of a semiconductor material such as, but not limited to Si, SiGe and Ge. Bandgap adjustment in the semiconductor material of the underlying layer 110 is optionally performed to tune the carrier concentration in the underlying layer 110, and this is achieved using an ion implantation method, in some embodiments. Alternately, the underlying layer 110 is made of a conducting material including one or more of Co, Ni, W, Ti, Ta, Cu, Al, TiN and TaN for forming wiring lines of a circuitry or a device. The structure of the material in the underlying layer is crystalline, polycrystalline, nanostructured, and two-dimensional sheet, in some embodiments. Also, in some embodiments, the underlying layer 110 is a portion of an integrated circuit (IC) chip, a system on chip (SoC), or portion thereof, that includes various passive and active microelectronic devices, such as resistors, multilayered capacitors, coil inductors, fuses, diodes, metal-oxide-semiconductor FETs (MOSFETs), complementary MOS (CMOS) transistors, FinFET, gate-all-around (GAA) FET and other suitable components, or combinations thereof. In other embodiments, the underlying layer 110 is one or more layers of dielectric material, such as $SiO_2$, $Si_3N_4$, SiON, SiCN, or SiOCN.

In FIGS. 22(a) and 22(b), a hard mask layer 120 is formed over the substrate 100 and on the underlying layer 110. In some embodiments, the hard mask layer 120 is formed of a material such as, but not limited to, silicon oxide, silicon nitride, silicon carbide, or other suitable hard mask material, or combinations thereof. The hard mask layer 120 is formed by a deposition process such as chemical vapor deposition (CVD), including low pressure CVD (LPCVD) and plasma enhanced CVD (PECVD), physical vapor deposition (PVD), atomic layer deposition (ALD), or other suitable process.

On the hard mask layer 120, a photoresist layer 130 is formed by spin coating or self-assembly, in some embodiments. The photoresist layer 130 is a positive resist (a type of photoresist in which the portion of the photoresist that is exposed to light becomes soluble in the photoresist developer and the unexposed portion of the photoresist remains insoluble in the photoresist developer) or a negative photoresist (a type of photoresist in which the portion of the photoresist that is exposed to light becomes insoluble in the photoresist developer and the unexposed portion of the photoresist is dissolved by the photoresist developer).

In some embodiments, operations of pre-exposure baking, exposure, post-exposure baking, and development are carried out at the photoresist layer 130. The operation of exposure uses an electromagnetic wave having a wavelength of any value that can change the chemical structure of the photoresist layer 130 or energetic particles. The exposure source includes high-pressure mercury lamp with a wavelength of about 436 nm g-line and a wavelength of about 365 nm i-line), deep UV (DUV) with wavelengths of about 248 nm (KrF laser) and about 193 nm (ArF laser), and extreme UV (EUV) with a wavelength in a range from about 10 nm to about 15 nm, e-beam, and X-ray. The electromagnetic wave or energetic particle passes through transparent portions or openings of the mask M and reaches the photoresist layer 130 in some embodiments. In some embodiments, maskless photolithography is used and electromagnetic wave of energetic particles form a pattern by controlling an optical or electromagnetic system (in case of e-beam) on the photoresist layer 130 without using a mask, and in this method, the precision of the patterning relies solely on the electromagnetic optics instead of the mask. In some embodiments, other techniques are used to form a pattern on the photoresist layer 130, and the techniques include cyclotron photolithography, atomic force microscopic (AFM) cantilever writing or positron beam photolithography.

FIGS. 23(a) and 23(b) show the structure, after the operation of development of the photoresist layer 130 is performed. Depending on the material of the photoresist layer, the exposed and developed region of the photoresist layer can be either removed by dissolution to show the desired pattern or remain as desired patterns. The patterned photoresist layers 130' are formed on the hard mask layer 120, duplicating the pattern provided by the shape of the mask M in FIGS. 22(a) and 22(b).

FIGS. 24(a) and 24(b) show an etching operation performed on the hard mask layer 120 using the developed photoresist layer 130' as an etching mask, to form patterned hard mask layer 120'. FIGS. 25(a) and 25(b) show the patterned photoresist layer 130' is removed. In some embodiments, the patterned photoresist layer 130' is removed by a plasma ashing operation or a wet removal process.

FIGS. 26(a) and 26(b) show an operation of directional ion implantation applied to an exposed sidewall surface of the patterned hard mask layer 120'. The energetic species 400 includes arsenic ($As^{75}$), phosphorus ($P^{31}$) or boron ($B^{11}$) ions and are aimed at the sidewall surface of the patterned hard mask layer 120', and the species 400 undergo diffusion and interaction with the atoms for a diffusion length from the sidewall surface of the patterned hard mask layer 120'. The ion implantation dose is in a range of $10^{15}$ to $5\times10^{16}$ $cm^{-2}$ with an implantation energy of 30 to 100 keV. The energetic species 400 would eventually stabilize in the patterned hard mask layer 120' within a region defined by this diffusion length, which is a very thin layer under the sidewall surface of the patterned hard mask layer 120'. FIGS. 27(a) and 27(b) show the outcome of the directional ion implantation. The thick black lines in FIGS. 27(a) and 27(b) indicate the regions that undergo substantial ion implantation, forming a hardened hard mask layer 150.

FIGS. 28(a) and 28(b) show an operation of directional etching 200 targeting the patterned hard mask layer 120' that has not undergone the directional ion implantation. FIGS. 28(a) and 28(b) show that the energetic species of the directional etching method are aimed at the left sidewall surfaces of the hard mask layer 120'. The etchant targets the hard mask layer 120' instead of the ion-implanted hardened hard mask layer 150. The etchant source gas includes a fluorine containing gas without oxygen, in some embodiments. In another embodiment, the etchant source gas also includes argon. The etching operation of FIGS. 28(a) and 28(b) is directional etching or surface directional etching process (also referred to as a horizontal directional etching process) performed to directly modify a horizontal profile of the hard mask features of patterned hard mask layer 120' so as to reduce an edge-to-edge or end-to-end (EE) distance within a feature in the patterned hard mask layer 120'. The directional etching method in FIGS. 28(a) and 28(b) removes the right vertical portion of the patterned hard mask layer 120' (FIGS. 28(a) and 29(a)) while the hardened hard mask layer 150 remains (the outcome of the etching operation of FIGS. 28(a) and 28(b) is shown in FIGS. 29(a) and 29(b)). The surface directional etching process is a selective dry etching process that selectively etches the hard mask layer 120'. The selective dry etching process directs an etching species or energetic species in a substantially horizontal direction relative to a horizontal surface of substrate 100, thereby achieving horizontal etching of the hard mask layer 120'. In this disclosure, the substantially horizontal direction generally refers to the etching species or energetic species being directed towards a horizontal surface of substrate 100 at an angle of about 0° to about 20° relative to the horizontal surface in the x-y plane (substantially parallel to the horizontal surface of the substrate). In some embodiments, the angle is less than or equal to about 10°. Depending on desired horizontal etching, the angle can be tuned to different values. In some embodiments, the angle can be adjusted so that the etching species or energetic species are along the x axis, y axis, or z axis. In some embodiments, the surface directional etching process is a plasma etching process tuned to cause plasma to flow in an in-plane direction, such as along the y axis, over substrate 100.

Various etching parameters can be tuned to generate etching species (radicals) that travel in a horizontal direction, such as etchant composition, etching temperature, etching time, etching pressure, radio frequency (RF) bias voltage, RF bias power, etchant flow rate, wafer tilting, other suitable etching parameters, or combinations thereof. In some embodiments, RF bias voltage is tuned to achieve an electric field that causes etching species to flow substantially horizontally along an in-plane direction (for example, in the y axis direction) relative to a surface over substrate 100. In some embodiments, the etching species are tuned to have a profile of momenta of the energetic species such as the momenta of the etching species or energetic species along a frontline are not the same, i.e. the momentum of an etching or energetic species on the top path is different from the momentum of an etching or energetic species on the bottom path. In some embodiments, the momentum of an etching or energetic species on the top path is different from the momentum of an etching or energetic species in the middle path above the bottom path, and the momentum of the etching or energetic species on the top path is the same as or different from the momentum of an etching or energetic species on the bottom path. Any combinations can be achieved by adjustment of the electromagnetic control to tune the energies of the etching or energetic species along the etching front.

FIGS. 29(a) and 29(b) show the remaining hardened patterned hard mask layer 150 of FIGS. 28(a) and 28(b) have an EE length of $w_H$ smaller than the smallest dimension achieved by photolithographic and etching methods used for anisotropic etching of the underlying layer 110, thereby forming patterned underlying layer 110' having the same EE length as the hardened hard mask layer 150. FIGS. 30(a) and 30(b) show the patterned underlying layer with the line width of $w_H$ smaller than the smallest dimension achieved by photolithographic and etching method. Additional steps can be provided before, during, and after the operations of FIGS. 22(a), 22(b), 23(a), 23(b), 24(a), 24(b), 25(a), 25(b), 26(a), 26(b), 27(a), 27(b), 28(a), 28(b), 29(a), 29(b), 30(a), and 30(b), and some of the operations described can be removed, replaced, or eliminated for additional embodiments. Combinations of any of the operations in this disclosure can be performed for other possible embodiments in this disclosure.

FIGS. 31, 32, and 33 show various views illustrating various stages of a sequential manufacturing operation of a semiconductor device according to an embodiment of the present disclosure. It is understood that additional operations may be provided before, during, and after the operations shown by FIGS. 31-33, and some of the operations described below can be replaced or eliminated for additional embodiments of the method. The order of the operations/processes may be interchangeable.

FIG. 31 shows the patterned hard mask layer 120' having top, middle, and bottom gaps formed by photolithographic and etching methods such as the operations of FIGS. 22(a), 22(b), 23(a), 23(b), 24(a), 24(b), 25(a), and 25(b), or the operations of FIGS. 10(a), 10(b), 11(a), 11(b), 12(a), 12(b), 13(a), 13(b), or the operations of 1(a), 1(b), 2(a), 2(b), 3(a), 3(b), 4(a), and 4(b). The arrows indicate the direction of the energetic species directed at the left and right sidewalls of the patterned hard mask layer 120'.

As shown in FIG. 31, the patterned hard mask layer 120' is formed by operations as set forth above. The patterned hard mask layer 120' has grooves (the grooves expose the underlying layer 110) facing other grooves in the x direction, respectively. In FIG. 31, the top groove g1 is formed of two portions, i.e. a left groove and a right groove. The middle groove g2 is formed of two portions, i.e. a left groove and a right groove. The bottom groove g3 is formed of two portions, i.e. a left groove and a right groove. As shown in FIG. 31, the distances of separation (width/gap) between adjacent left and right grooves of top, middle, and bottom grooves g1, g2, and g3 are not uniform, i.e. the distances between the left and right grooves along x direction at the bottom groove g3 and at the top groove g1 are larger than the distance between the left and right grooves along x direction in the middle groove g2. In the present embodiment, two directional ion implantation operations 31-L and 31-R are performed from the right side (R) and the left side (L) as shown in FIG. 31. The implanted depths are generally uniform among the grooves. For example, for the smallest "gap" portion of the patterned hard mask layer 120' in the middle groove g2 between the left and right grooves along x axis, the implanted ions are distributed in the entirety of the "gap" portion, and the entire middle portion of hard mask 120' between the left and right grooves along x axis becomes a hardened portion. In contrast, for the long distance "gap" portions at the bottom groove g3 and at the top groove g1, the peak of the dopant concentration locates in the middle region of the "gap" portion, while end portions of the bottom "gap" portion have less dopant. Accordingly, only the middle region of the "gap" portion is hardened, while the end portions are not. After the implantation, when the etching operation is performed, the hardened portions are not etched, forming substantially uniform end-to-end patterns. FIG. 33 shows the uniform pattern ends with uniform separation between the left and right grooves of top groove g1', middle groove g2', and bottom groove g3'.

FIG. 32 shows an on-going process of applying the energetic species during the bi-directional etching. In particular, applying energetic particles to the top portions of the patterned hard mask layer 120' between the left and right grooves of the top groove g1. The momenta of the energetic species from the left side and from the right side do not enable the species from the left side and the species from the right side to meet each other in the middle gap portion of the patterned hard mask layer 120', and the energetic species reach the border of the gap portion and do not stay in the end portions, causing that the end portions are not hardened and a narrower region (FIGS. 32 and 33) in the top portion of the patterned hard mask layer 120' between the top left and right grooves of top groove g1 is not etched by the directional etching (FIG. 33). In some embodiments, the method in FIG. 32 is used to produce a very fine line pattern of the patterned hard mask layer 120' which remains after the directional etching, facilitating etching of the underlying layer 110 to form a fine line pattern in the underlying layer 110 to have an EE length smaller than the smallest dimension achieved by the photolithographic and etching methods of the hard mask layer 120'.

FIG. 32 shows that in the middle groove g2 of the patterned hard mask layer 120', the directional etching species from the left side meet the species from the right side, causing complete overlapping of momenta of the energetic species in the entire gap portion between the left and right grooves along x axis from the species from the right and the species from the left. The momenta cancellation renders the middle gap portion of the patterned hard mask layer 120' between the left and right grooves of the middle groove g2 not etched. FIG. 33 shows that the middle portion of the patterned hard mask layer 120' between the left and right grooves of the middle groove g2, after the directional etching operation of FIGS. 31 and 32, has an unchanged dimension.

FIG. 32 shows that in the bottom portion of the patterned hard mask layer 120' between the bottom left and right grooves of the bottom groove g3, the energetic species only diffuse into a border of the gap portion of the patterned hard mask layer 120' between end portions and do not stay in the end portions, leaving end portions not hardened by ion implantation by the species. FIG. 33 shows that, after the directional etching, the left and right end portions of the bottom portion of the patterned hard mask layer 120' are etched while the middle gap portion is not etched, i.e. a situation like the top gap portion between the left and right grooves of the top groove g1 of the patterned hard mask layer 120'. Therefore, FIGS. 31, 32, and 33 provide a demonstration of a method not just for forming a fine line pattern having a dimension or EE length smaller than the smallest dimension achieved by another photolithographic or etching methods, but also for making the line pattern even, i.e. the distances between the grooves along x axis are about the same.

In some embodiments, the momenta of the energetic species of the directional etch process from the left side in FIG. 31 and the momenta of the energetic species of the directional etch process from the right side in FIG. 31 are controlled to be the same. In some embodiments, the momenta of the energetic species of the directional etch process from the left side in FIG. 31 are controlled to be different from the momenta of the energetic species of the directional etch process from the right side in FIG. 31, achieving different etching rates at the left and right sides. In some embodiments, the momenta of the energetic species of the directional etch process from the left side in FIG. 31 is controlled to be smaller than the momenta of the energetic species of the directional etch process from the right side in FIG. 31, so as to reduce the etching rate on the left side for achieving a final structure having a central axis positioned closer to the left side. This application can be used for evenly etching a tilted substrate to form an even pattern without extensive adjustment of a tilted substrate.

FIGS. 34, 35, 36, 37, 38, and 39 show cross-sectional views of a semiconductor device, at various fabrication operations, according to an embodiment of the present disclosure. FIG. 34 shows a structure having a substrate 100, a hard mask layer 500 formed on the substrate 100, a bit line (BL) 510 formed on the hard mask layer 500, a metal line (ML) 520 formed on the BL layer 510, and a patterned photoresist layer 530 formed on the ML layer 520, according to some embodiments of the present disclosure. The substrate 100 is formed of the above mentioned materials. The hard mask layer 500 includes a silicon nitride layer, according to some embodiments of the present disclosure. The BL layer 510 is formed of a material including WSi, WN, WSi, and polysilicon, according to some embodiments of the present disclosure. The ML layer 520 is formed of a material including W and Al, according to some embodiments of the present disclosure.

FIG. 35 shows an operation of anisotropic etching performed to etch the ML layer 520, forming patterned ML layer 520'. During this operation, a top portion of the photoresist layer 530 is also etched, according to some embodiments of the present disclosure. FIG. 36 shows an operation of removal of the photoresist layer 530. FIG. 37 shows an operation of anisotropic etching of the BL layer 510, forming patterned BL layer 510', according to some embodiments of the present disclosure.

FIG. 38 shows an operation of ion implantation softening of the patterned ML layer 520', forming softened ML layer 520". The softening of the ML layer 520' is achieved by ion implantation effected by bombarding the surface of the ML layer 520' with at least one of the following ions: nitrogen, oxygen, carbon, boron, aluminum, magnesium, silicon, titanium, yttrium, nickel, fluoride, chloride, and any of the inert gases of helium, neon, argon, krypton, xenon, according to some embodiments of the present disclosure. The ion-implantation parameters include a time duration from a few seconds to about one hour, a dose ranging from about $1\times10^{14}$ to about $1\times10^{18}$, an energy level from about 10 keV to about 5000 keV, and a current density from about 0.1 $\mu A/cm^2$ to about 10 $\mu A/cm^2$. The implantation depth is controlled to render the ML layer 520' softened. FIG. 39 shows an operation of removal of the softened ML layer 520" using a mild etch. In further steps, the BL layer 510' is used as a mask to etch the hard mask layer 500. With this process shown in FIGS. 34-39, the softened ML layer 520" can be efficiently removed.

Additional steps can be provided before, during, and after the operations of FIGS. 31, 32, and 33, and some of the operations described can be removed, replaced, or eliminated for additional embodiments. Combinations of any of the operations in this disclosure can be performed for other possible embodiments in this disclosure.

The present disclosure describes an exemplary method of manufacturing a semiconductor device. The method includes operations of forming a first hard mask over an underlying layer on a substrate by a photolithographic and etching method, forming a sidewall spacer pattern having a first sidewall portion and a second sidewall portion on opposing sides of the first hard mask, etching the first sidewall portion, etching the first hard mask and leaving the second sidewall portion bridging a gap of the etched first hard mask, and processing the underlying layer through the second hard mask. In one or more of the foregoing or following embodiments, in the etching the first hard mask, the first hard mask is fully removed. In one or more of the foregoing or following embodiments, in the etching the first hard mask, the first hard mask is only partially removed. In one or more of the foregoing or following embodiments, the etching the first sidewall portion of the sidewall spacer pattern is performed by directional etching. In one or more of the foregoing or following embodiments, the etching the first hard mask is performed by directional etching. In one or more of the foregoing or following embodiments, the first hard mask has a first width and the second hard mask has a second width smaller than the first width. In one or more of the foregoing or following embodiments, the second width has a value in a range from 0.5 nm to 5 nm. In one or more of the foregoing or following embodiments, the sidewall spacer pattern is formed of a material including silicon nitride.

The present disclosure describes another exemplary method of manufacturing a semiconductor device. The method includes operations of forming a first hard mask over a device layer on a substrate by a photolithographic and etching method, hardening a sidewall portion of the first hard mask, etching a portion of the first hard mask contacting the hardened sidewall portion so as to result in a second hard mask comprising the hardened sidewall portion bridging a gap in the etched first hard mask, and processing the device layer through the second hard mask. In one or more of the foregoing or following embodiments, the first hard mask contacting a mid-portion of the hardened sidewall portion, after the etching the portion of the first hard mask, is removed. In one or more of the foregoing or following embodiments, the hardening is performed by directional implantation. In one or more of the foregoing or following embodiments, the etching the portion of the first hard mask contacting the hardened sidewall portion is performed by directional etching. In one or more of the foregoing or following embodiments, the first hard mask has a first width and the second hard mask has a second width smaller than the first width.

The present disclosure describes another exemplary method of manufacturing a semiconductor device. The method includes operations of forming a first hard mask over a device layer on a substrate by a photolithographic and etching method, performing a directional etching process to etch opposite side portions of a portion of the first hard mask between two gaps from two opposite directions, and processing the underlying layer through the etched first hard mask. In one or more of the foregoing or following embodiments, the portion of the first hard mask between the two gaps is narrowed to a width or end-to-end distance less than the smallest dimension achieved by the photolithographic and etching method. In one or more of the foregoing or following embodiments, the portion of the first hard mask between the two gaps is not etched by the directional etching. In one or more of the foregoing or following embodiments, the portion of the first hard mask between the two gaps is narrowed. In one or more of the foregoing or following embodiments, momenta of energetic species of the directional etching from the two opposite directions are controlled. In one or more of the foregoing or following embodiments, momenta of energetic species of the directional etching from a left direction of the two opposite direction is controlled to be different from momenta of energetic species of the directional etching from a right direction of the two opposite direction. In one or more of the foregoing or following embodiments, the momenta of the energetic species of the directional etching from the left direction is controlled to be smaller than the momenta of the energetic species of the directional etching from the right direction.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pattern formation method, comprising:
   forming a first hard mask over an underlying layer on a substrate by a photolithographic and etching operation;
   forming a sidewall spacer pattern having a first sidewall portion and a second sidewall portion on opposing sides of the first hard mask;
   etching the first sidewall portion and at least a part of the first hard mask, leaving the second sidewall portion using an directional etching process without covering the second sidewall portion, thereby forming a second hard mask; and
   processing the underlying layer using the second hard mask.

2. The pattern formation method of claim 1, wherein the directional etching process comprises providing etching species towards a horizontal surface of the underlying layer at an angle of 0° to 20° relative to the horizontal surface.

3. The pattern formation method of claim 1, wherein the directional etching process comprises providing etching species towards a horizontal surface of the underlying layer at an angle of 0° to 10° relative to the horizontal surface.

4. The pattern formation method of claim 1, wherein the direction etching process fully removes a part of the first hard mask disposed between the first sidewall portion and the second sidewall portion.

5. The pattern formation method of claim 1, wherein the direction etching process only partially removes a part of the first hard mask disposed between the first sidewall portion and the second sidewall portion.

6. The pattern formation method of claim 5, wherein the second hard mask includes the second sidewall portion and a remaining part of the first hard mask.

7. The pattern formation method of claim 1, wherein the first hard mask has a first width and the second hard mask has a second width smaller than the first width.

8. The pattern formation method of claim 7, wherein the second width has a value in a range from 0.5 nm to 5 nm.

9. The pattern formation method of claim 1, wherein the sidewall spacer pattern is formed of a material including silicon nitride.

10. The pattern formation method of claim 1, wherein the underlying layer is a conductive layer made of one or more of Co, Ni, W, Ti, Ta, Cu, Al, TiN or TaN.

11. A pattern formation method, comprising:
    forming a hard mask layer over an underlying layer;
    forming a first hard mask pattern by patterning by using a lithography operation and an etching operation the hard mask layer;
    hardening a sidewall portion of the first hard mask pattern by using a directional implantation process;
    etching a portion of the first hard mask pattern by a directional etching process without covering the first hard mask pattern, leaving at least the hardened sidewall portion, resulting in a second hard mask pattern; and
    patterning the underlying layer using the second hard mask pattern as an etching mask.

12. The pattern formation method of claim 11, wherein the directional implantation process comprises providing ions towards a horizontal surface of the underlying layer at an angle of 0° to 20° relative to the horizontal surface.

13. The pattern formation method of claim 12, wherein the ions comprises one or more of As ions or P ions.

14. The pattern formation method of claim 12, wherein the directional implantation process comprises an ion implantation dose in a range of $10^{15}$ cm$^{-2}$ to $5 \times 10^{16}$ cm$^{-2}$.

15. The pattern formation method of claim 12, wherein the directional implantation process comprises an implantation energy of 30 keV to 100 keV.

16. The pattern formation method of claim 11, wherein the directional etching process comprising providing etching species towards the horizontal surface at an angle of 0° to 20° relative to the horizontal surface.

17. The pattern formation method of claim 11, wherein the direction etching process only partially removes a part of the first hard mask pattern not hardened by the directional ion implantation process.

18. The pattern formation method of claim 17, wherein the second hard mask pattern includes the hardened sidewall portion and a remaining part of the first hard mask pattern not hardened.

* * * * *